US009972716B2

United States Patent
Kim et al.

(10) Patent No.: US 9,972,716 B2
(45) Date of Patent: May 15, 2018

(54) SEMICONDUCTOR DEVICES

(71) Applicants: Jin-Bum Kim, Seongnam-si (KR); Seok-Hoon Kim, Suwon-si (KR); Chul Kim, Hwaseong-si (KR); Kwan-Heum Lee, Yongin-si (KR); Byeong-Chan Lee, Asan-si (KR); Cho-Eun Lee, Asan-si (KR); Su-Jin Jung, Asan-si (KR); Bon-Young Koo, Asan-si (KR)

(72) Inventors: Jin-Bum Kim, Seongnam-si (KR); Seok-Hoon Kim, Suwon-si (KR); Chul Kim, Hwaseong-si (KR); Kwan-Heum Lee, Yongin-si (KR); Byeong-Chan Lee, Asan-si (KR); Cho-Eun Lee, Asan-si (KR); Su-Jin Jung, Asan-si (KR); Bon-Young Koo, Asan-si (KR)

(73) Assignee: Samsung Electronics Co., Ltd. (KR)

( * ) Notice: Subject to any disclaimer, the term of this patent is extended or adjusted under 35 U.S.C. 154(b) by 3 days.

(21) Appl. No.: 14/826,439

(22) Filed: Aug. 14, 2015

(65) Prior Publication Data
US 2016/0049511 A1 Feb. 18, 2016

(30) Foreign Application Priority Data
Aug. 14, 2014 (KR) .......................... 10-2014-0106102

(51) Int. Cl.
H01L 29/78 (2006.01)
H01L 29/06 (2006.01)
(Continued)

(52) U.S. Cl.
CPC .... *H01L 29/7848* (2013.01); *H01L 29/66545* (2013.01); *H01L 29/785* (2013.01)

(58) Field of Classification Search
CPC ......... H01L 27/0886; H01L 21/823431; H01L 21/823821; H01L 21/845; H01L 27/0924; H01L 27/1211; H01L 29/41791; H01L 29/66795; H01L 29/7848; H01L 29/66636; H01L 29/0657; H01L 29/7851; (Continued)

(56) References Cited

U.S. PATENT DOCUMENTS 7,579,617 B2  8/2009  Shimamune et al.
7,667,227 B2  2/2010  Shimamune et al.
(Continued)

FOREIGN PATENT DOCUMENTS

JP  2006-270051  10/2006
JP  2007-036205  2/2007
(Continued)

*Primary Examiner* — Yu Chen
*Assistant Examiner* — Pauline Vu
(74) *Attorney, Agent, or Firm* — Myers Bigel, P.A.

(57) ABSTRACT

Provided are semiconductor devices that include an active pattern on a substrate, first and second gate electrodes on the active pattern and arranged in a first direction relative to one another and a first source/drain region in a first trench that extends into the active pattern between the first and second gate electrodes. The first source/drain region includes a first epitaxial layer that is configured to fill the first trench and that includes at least one plane defect that originates at a top portion of the first epitaxial layer and extends towards a bottom portion of the first epitaxial layer.

18 Claims, 35 Drawing Sheets

(51) Int. Cl.
*H01L 29/32* (2006.01)
*H01L 29/66* (2006.01)

(58) Field of Classification Search
CPC ......... H01L 29/7842; H01L 21/823814; H01L 21/823418; H01L 29/7847; H01L 29/785
See application file for complete search history.

(56) References Cited

U.S. PATENT DOCUMENTS

| | | | |
|---|---|---|---|
| 7,683,362 B2 | 3/2010 | Ohta et al. | |
| 7,791,064 B2 | 9/2010 | Shimamune et al. | |
| 7,808,081 B2 | 10/2010 | Bryant et al. | |
| 7,847,321 B2 | 12/2010 | Hara | |
| 7,875,521 B2 | 1/2011 | Shimamune et al. | |
| 7,943,969 B2 | 5/2011 | Yang et al. | |
| 7,968,414 B2 | 6/2011 | Ohta et al. | |
| 8,164,085 B2 | 4/2012 | Shimamune et al. | |
| 8,168,505 B2 | 5/2012 | Yang et al. | |
| 8,264,012 B2 | 9/2012 | Hara | |
| 8,269,256 B2 | 9/2012 | Tamura | |
| 8,466,450 B2 | 6/2013 | Shimamune et al. | |
| 8,598,003 B2 | 12/2013 | Murtthy et al. | |
| 8,648,424 B2 | 2/2014 | Chung et al. | |
| 8,674,453 B2 | 3/2014 | Tsai et al. | |
| 2006/0202233 A1 | 9/2006 | Hara | |
| 2008/0073667 A1* | 3/2008 | Lochtefeld | H01L 29/66795 257/190 |
| 2009/0039361 A1* | 2/2009 | Li | H01L 21/02381 257/94 |
| 2011/0127610 A1* | 6/2011 | Lee | H01L 21/823431 257/365 |
| 2012/0292715 A1* | 11/2012 | Hong | H01L 21/845 257/392 |
| 2013/0009216 A1* | 1/2013 | Tsai | H01L 21/823807 257/288 |
| 2013/0099294 A1* | 4/2013 | Lu | H01L 21/76232 257/288 |
| 2013/0099314 A1* | 4/2013 | Lu | H01L 21/26506 257/347 |
| 2013/0146949 A1* | 6/2013 | Tsai | H01L 21/26506 257/288 |
| 2013/0187237 A1* | 7/2013 | Yu | H01L 21/823807 257/369 |
| 2013/0200455 A1* | 8/2013 | Lo | H01L 29/66795 257/347 |
| 2013/0207166 A1 | 8/2013 | Chen et al. | |
| 2013/0248930 A1 | 9/2013 | Shimamune et al. | |
| 2013/0248948 A1 | 9/2013 | Ma et al. | |
| 2013/0270638 A1 | 10/2013 | Adam et al. | |
| 2013/0292777 A1* | 11/2013 | Liaw | G11C 11/412 257/369 |
| 2013/0328126 A1* | 12/2013 | Tsai | H01L 29/41783 257/368 |
| 2014/0134818 A1* | 5/2014 | Cheng | H01L 29/66636 438/300 |
| 2014/0203362 A1* | 7/2014 | Kim | H01L 27/0886 257/347 |
| 2014/0264348 A1* | 9/2014 | Tsai | C30B 25/165 257/57 |
| 2014/0264610 A1* | 9/2014 | Yang | H01L 29/6681 257/368 |
| 2015/0097197 A1* | 4/2015 | Ganz | H01L 29/785 257/77 |
| 2015/0179796 A1* | 6/2015 | Sung | H01L 29/7848 257/288 |
| 2015/0194524 A1* | 7/2015 | Hu | H01L 29/7848 257/409 |
| 2015/0206939 A1* | 7/2015 | Huang | H01L 29/66628 257/77 |
| 2015/0221509 A1* | 8/2015 | Chen | H01L 29/7848 257/77 |
| 2015/0270342 A1* | 9/2015 | Tsai | H01L 29/0847 257/43 |
| 2016/0204256 A1* | 7/2016 | Jackson | H01L 29/32 257/288 |

FOREIGN PATENT DOCUMENTS

| | | |
|---|---|---|
| JP | 2009-016866 | 1/2009 |
| KR | 1020090044050 A | 5/2009 |

* cited by examiner

SEMICONDUCTOR DEVICES

This application claims priority from Korean Patent Application No. 10-2014-0106102 filed on Aug. 14, 2014 in the Korean Intellectual Property Office, the disclosure of which is incorporated herein by reference in its entirety.

BACKGROUND

As one of the scaling techniques for increasing the density of semiconductor devices, a multi-gate transistor has been suggested. A multi-gate transistor may be obtained by forming a fin-shaped silicon body on a substrate and forming gates on the surface of the silicon body.

A multi-gate transistor can be scaled due to a three-dimensional (3D) channel that may be used. In addition, the current control capability can be improved without the need to increase the gate length of the multi-gate transistor. Moreover, it is possible to effectively suppress a short channel effect (SCE) in which an electric potential of a channel region is affected by a drain voltage.

SUMMARY

Aspects of the present inventive concept provide semiconductor devices in which the performance of an element can be improved by forming a source/drain region having a stacking fault in order to prevent the alleviation of stress applied to a channel region. Some embodiments of the present inventive concept include semiconductor devices that include an active pattern on a substrate, first and second gate electrodes on the active pattern and arranged in a first direction relative to one another and a first source/drain region in a first trench that extends into the active pattern between the first and second gate electrodes. Some embodiments provide that the first source/drain region includes a first epitaxial layer that is configured to fill the first trench and that includes at least one plane defect that originates at a top portion of the first epitaxial layer and extends towards a bottom portion of the first epitaxial layer.

Some embodiments include first and second gate spacers on sidewalls of the first and second gate electrodes, respectively, and each configured to include a portion that extends beyond a sidewall of the first trench to have a first distance between the first and second gate spacers that is less than a second distance between opposite sidewalls of the first trench.

In some embodiments, the semiconductor device comprises a p-channel metal oxide semiconductor (PMOS) and the first epitaxial material includes a compressive stress material that includes a lattice constant that is greater than a lattice constant of the active pattern.

Some embodiments provide that the semiconductor device includes an n-channel metal oxide semiconductor (NMOS) and the first epitaxial material includes a tensile stress material that includes a lattice constant that is smaller than a lattice constant of the active pattern.

In some embodiments, the first source/drain region includes an elevated source/drain region that includes a topmost surface that protrudes further away from the substrate than a top surface of the active pattern.

Some embodiments provide that the first epitaxial layer includes a first lower epitaxial layer that is on at least a portion of a bottom surface of the first trench, a first upper epitaxial layer that is on the first lower epitaxial layer and a first capping epitaxial layer that is on the first upper epitaxial layer.

In some embodiments, the at least one plane defect includes a first plane defect the first epitaxial layer further includes a second plane defect that originates at a top portion of the first epitaxial layer and extends towards a bottom portion of the first epitaxial layer. In some embodiments, the first plane defect and the second plane defect each extend towards one another at an angle relative to a top surface of the active pattern and do not meet with one another.

Some embodiments include first and second gate spacers on sidewalls of the first and second gate electrodes, respectively. In some embodiments, the first plane defect is overlapped by the first gate spacer in a third direction that extends away from the substrate and the second plane defect is overlapped by the second gate spacer in the third direction.

Some embodiments provide that the first epitaxial layer includes a first lower epitaxial layer that is on at least a portion of a bottom surface of the first trench and a first upper epitaxial layer that is on the first lower epitaxial layer. In some embodiments, the first plane defect and the second plane defect propagate from the first upper epitaxial layer and terminate within the first upper epitaxial layer.

Some embodiments include first and second gate spacers on sidewalls of the first and second gate electrodes, respectively, and provide that a height of the first plane defect from the fin-type active pattern increases as the distance from the first gate electrode decreases.

Some embodiments include first and second gate spacers on sidewalls of the first and second gate electrodes, respectively, and provide that a width of the first plane defect decreases as a distance to the first gate electrode decreases.

In some embodiments, the first epitaxial layer includes a first lower epitaxial layer that is on at least a portion of a bottom surface of the first trench and a first upper epitaxial layer that is on the first lower epitaxial layer and the first lower epitaxial layer contacts a bottom surface of each of the first and second gate spacers.

Some embodiments provide that the at least one plane defect includes a first plane defect, the first epitaxial layer further includes a second plane defect that terminates within the first epitaxial layer, and the first and second plane defects propagate from the first lower epitaxial layer and terminate in the first upper epitaxial layer.

In some embodiments, the at least one plane defect includes a first plane defect, the first epitaxial layer further includes a second plane defect that terminates within the first epitaxial layer, and the first plane defect meets the second plane defect in the first epitaxial layer.

Some embodiments include first and second gate spacers on sidewalls of the first and second gate electrodes, respectively, and provide that the first epitaxial layer includes a first lower epitaxial layer that is on at least a portion of a bottom surface of the first trench and a first upper epitaxial layer that is on the first lower epitaxial layer. In some embodiments, a height, relative to the substrate, of the first upper epitaxial layer at a midpoint between the first gate electrode and the second gate electrode is less than a height, relative to the substrate, of the first upper epitaxial layer where the first upper epitaxial layer meets the first gate electrode spacer or the second gate electrode spacer.

In some embodiments, the active pattern includes a fin-type active pattern extending from a top surface of the substrate and extending in the first direction and the first and second gate electrodes extend across the fin-type active pattern in a second direction that is different from the first direction. In some embodiments, the fin-type active pattern includes a first fin-type active pattern. Some embodiments include a second fin-type active pattern extending from the top surface of the substrate and in the first direction and spaced apart from the first fin-type active pattern in the second direction and provide that the first and second gate electrodes are on and extend across the second fin-type pattern in the second direction. Some embodiments include a second source/drain region in a second trench that extends into the second fin-type active pattern between the first and second gate electrodes, the second source/drain region including a second epitaxial layer that is configured to fill the second trench and that includes at least one plane defect that is terminated within the second epitaxial layer.

In some embodiments, the second epitaxial layer includes a second lower epitaxial layer that is on at least a portion of a bottom surface of the second trench in the second fin-type active pattern, a second upper epitaxial layer that is on the second lower epitaxial layer, and a second capping epitaxial layer that is on the second upper epitaxial layer. Some embodiments provide that the first capping epitaxial layer is directly connected to the second capping epitaxial layer.

In some embodiments, the active pattern includes a fin-type active pattern extending from a top surface of the substrate and extending in the first direction and the first and second gate electrodes extend across the fin-type active pattern in a second direction that is different from the first direction. Some embodiments provide that the at least one plane defect includes a first plane defect, the first epitaxial layer includes a second plane defect that terminates within the first epitaxial layer, and the first trench is on a first side of the first gate electrode. Some embodiments include a second source/drain region in a second trench that extends into the active pattern on a second side of the first gate electrode, the second source/drain region including a second epitaxial layer that is configured to fill the second trench and that includes a third plane defect that originates at a top portion of the second epitaxial layer proximate the first gate electrode and extends towards a bottom portion of the second epitaxial layer.

In some embodiments, the second source/drain region is formed at an end of the fin-type active pattern.

Some embodiments include a dummy gate electrode that extends across the fin-type pattern in the second direction and is arranged in the first direction relative first and second gate electrodes and provide that the second trench is between the first electrode and the dummy gate electrode. In some embodiments, the second epitaxial layer includes a fourth plane defect that originates at a top portion of the second epitaxial layer proximate the dummy gate electrode and extends towards a bottom portion of the second epitaxial layer.

Some embodiments include a field insulating layer formed on the substrate and sidewalls of the fin-type active pattern and provide that a portion of the fin-type active pattern protrudes from the field insulating layer in a direction away from the substrate, a first region of the field insulating layer contacts long sides of the fin-type active pattern and a second region of the field insulating layer contacts short sides of the fin-type active pattern, and a portion of the fin-type active pattern is interposed between the second region of the field insulating layer and the second epitaxial layer.

Some embodiments include a field insulating layer formed on the substrate and sidewalls of the fin-type active pattern and provide that a portion of the fin-type active pattern protrudes from the field insulating layer in a direction away from the substrate, the dummy gate pattern includes a first portion that is formed on the fin-type active pattern and a second portion that is formed on the field insulating layer, and a portion of the fin-type active pattern is interposed between the second portion of the dummy gate electrode and the second epitaxial layer.

Some embodiments include a field insulating layer formed on the substrate and sidewalls of the fin-type active pattern and provide that a portion of the fin-type active pattern protrudes from the field insulating layer in a direction away from the substrate, a first region of the field insulating layer contacts long sides of the fin-type active pattern and a second region of the field insulating layer contacts short sides of the fin-type active pattern, and the second region of the field insulating layer contacts the second epitaxial layer.

Some embodiments include an isolation region that is formed in the fin-type pattern in the second direction and is arranged in the first direction relative first and second gate electrodes and a spacer formed on a sidewall of the isolation region and configured to include a portion that extends beyond a sidewall of the second trench. In some embodiments, the second epitaxial layer is between the first electrode and the isolation region. Some embodiments provide that the isolation region is a shallow trench isolation (STI) region.

In some embodiments, the active pattern includes a first fin-type active pattern extending from a top surface of the substrate and extending in the first direction, the first and second gate electrodes extend across the first fin-type active pattern in a second direction that is different from the first direction, the at least one plane defect includes a first plane defect, and the first epitaxial layer further includes a second plane defect that terminates within the first epitaxial layer. Some embodiments include a second fin-type active pattern extending from the top surface of the substrate and in the first direction and spaced apart from the first fin-type active pattern in the second direction, third and fourth gate electrodes on the second fin-type active pattern and arranged in the first direction relative to one another, a second source/drain region in a second trench in the second fin-type active pattern, the second source/drain region including a second epitaxial layer that is configured to fill the second trench, and first, second, third and fourth gate spacers on sidewalls of the first, second, third and fourth gate electrodes, respectively. In some embodiments, the first and second gate spacers are configured to include a portion that extends beyond a sidewall of the first trench to have a first distance between the first and second gate spacers that is less than a second distance between opposite sidewalls of the first trench, and the third and fourth gate spacers have a third distance between the third and fourth gate spacers that is less than a fourth distance between opposite sidewalls of the second trench.

In some embodiments, the active pattern includes a first fin-type active pattern extending from a top surface of the substrate and extending in the first direction, the first and second gate electrodes extend across the fin-type active pattern in a second direction that is different from the first direction, the at least one plane defect includes a first plane defect, and the first epitaxial layer further includes a second plane defect that terminates within the first epitaxial layer. Some embodiments include a second fin-type active pattern extending from the top surface of the substrate and in the first direction and spaced apart from the first fin-type active pattern in the second direction, third and fourth gate electrodes on the first and second fin-type active patterns and arranged in the first direction relative to one another, a second source/drain region in a second trench in the second fin-type active pattern, the second source/drain region including a second epitaxial layer that is configured to fill the second trench, and first, second, third and fourth gate spacers on sidewalls of the first, second, third and fourth gate electrodes, respectively. In some embodiments, the first and second gate spacers are configured to include a portion that extends beyond a sidewall of the first trench to have a first distance between the first and second gate spacers that is less than a second distance between opposite sidewalls of the first trench and the third and fourth gate spacers are configured to include a portion that extends beyond a sidewall of the second trench to have a third first distance between the third and fourth gate spacers that is less than a fourth distance between opposite sidewalls of the second trench.

In some embodiments, the substrate includes a first substrate region and a second substrate region, the first fin-type active pattern, the first epitaxial layer, and the first and second gate electrodes are in the first substrate region, and the second fin-type active pattern, the second epitaxial layer and the third and fourth gate electrodes are in the second substrate region.

However, aspects of the present inventive concept are not restricted to the one set forth herein. It is noted that aspects of the inventive concept described with respect to one embodiment, may be incorporated in a different embodiment although not specifically described relative thereto. That is, all embodiments and/or features of any embodiment can be combined in any way and/or combination. The above and other aspects of the present inventive concept will become more apparent to one of ordinary skill in the art to which the present inventive concept pertains by referencing the detailed description of the present inventive concept given below.

BRIEF DESCRIPTION OF THE DRAWINGS

The above and other aspects and features of the present inventive concept will become more apparent by describing in detail exemplary embodiments thereof with reference to the attached drawings.

DETAILED DESCRIPTION

Figure 1:
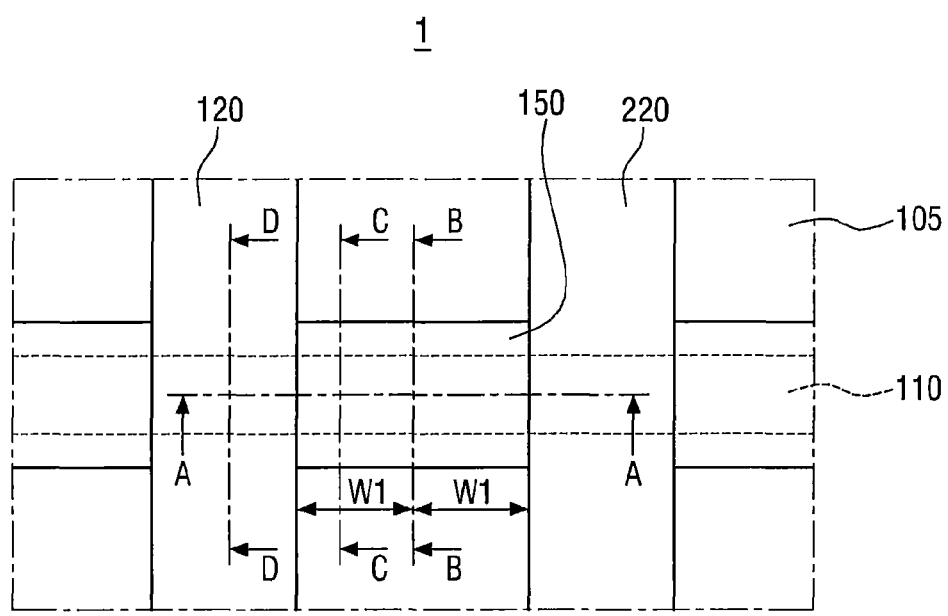
FIG. 1 is a plan view of a semiconductor device according to a first embodiment of the present inventive concept.
Figure 1:
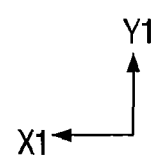

The present inventive concept will now be described more fully hereinafter with reference to the accompanying drawings, in which preferred embodiments of the inventive concept are shown. This inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. The same reference numbers indicate the same components throughout the specification. In the attached figures, the thickness of layers and regions is exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

The use of the terms "a" and "an" and "the" and similar referents in the context of describing the inventive concept (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this inventive concept belongs. It is noted that the use of any and all examples, or exemplary terms provided herein is intended merely to better illuminate the inventive concept and is not a limitation on the scope of the inventive concept unless otherwise specified. Further, unless defined otherwise, all terms defined in generally used dictionaries may not be overly interpreted.

A semiconductor device according to a first embodiment of the present inventive concept will now be described with reference to FIGS. 1 through 8.

Figure 2:
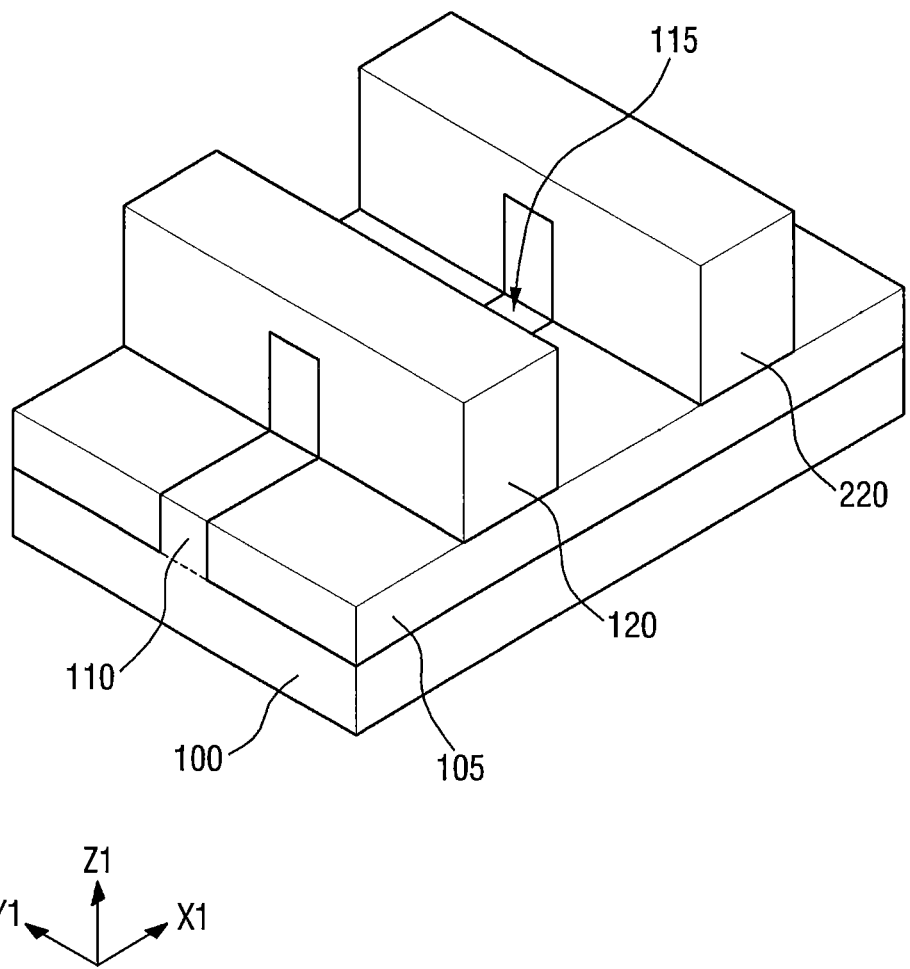
FIG. 2 is a perspective view of first and second gate electrodes and a first fin-type active pattern illustrated in FIG. 1.
Figure 3:
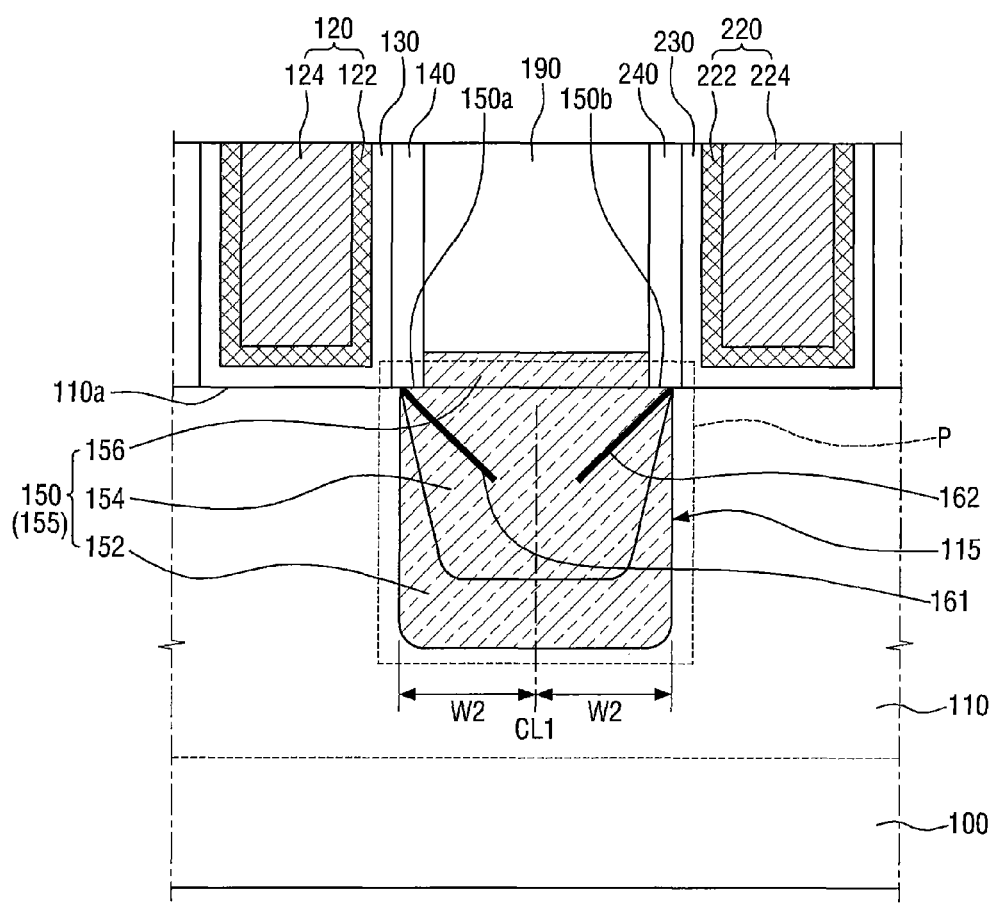
FIG. 3 is a cross-sectional view taken along the line A-A of FIG. 1.
Figure 4:
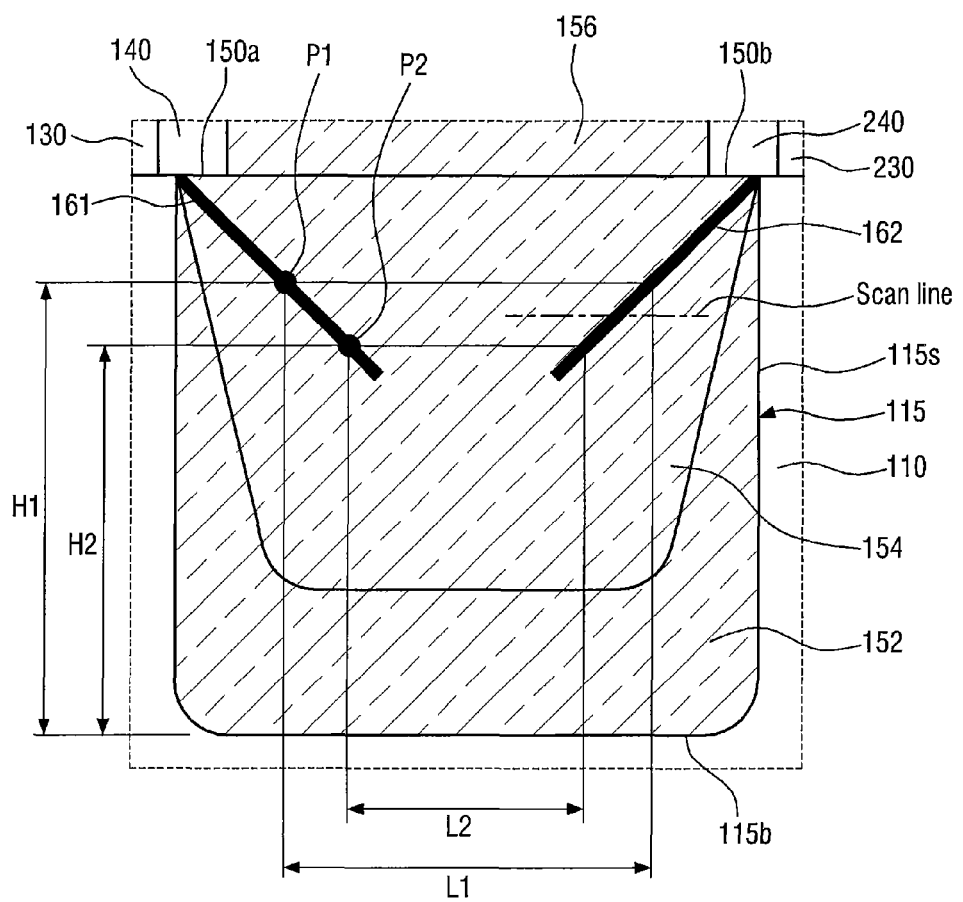
FIG. 4 is an enlarged view of a region 'P' illustrated in FIG. 3.
Figure 5:
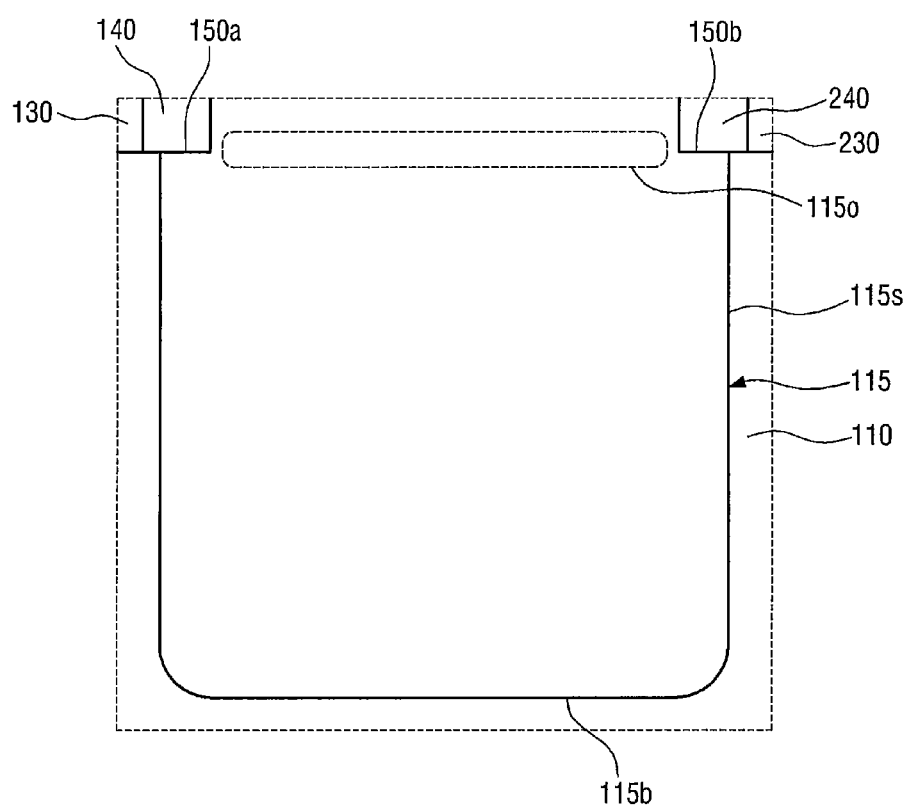
FIG. 5 is a view excluding a first epitaxial layer from FIG. 4.
Figure 6:
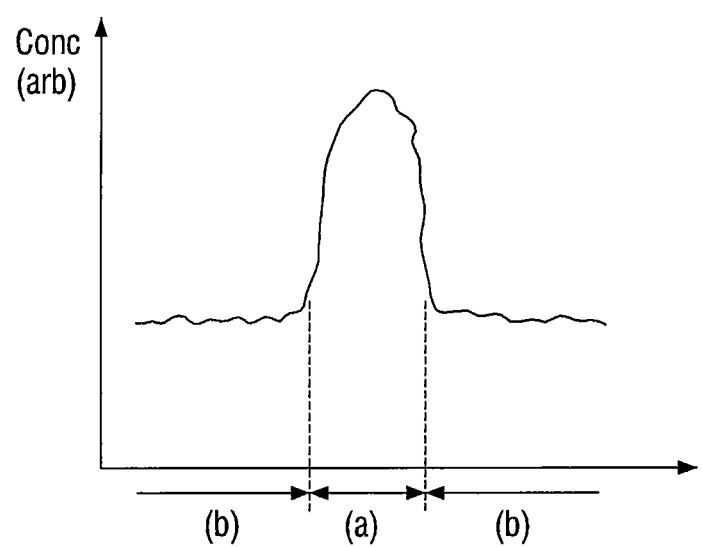
FIG. 6 is a diagram schematically illustrating the concentration of impurities along a scan line of FIG. 4.
Figure 7:
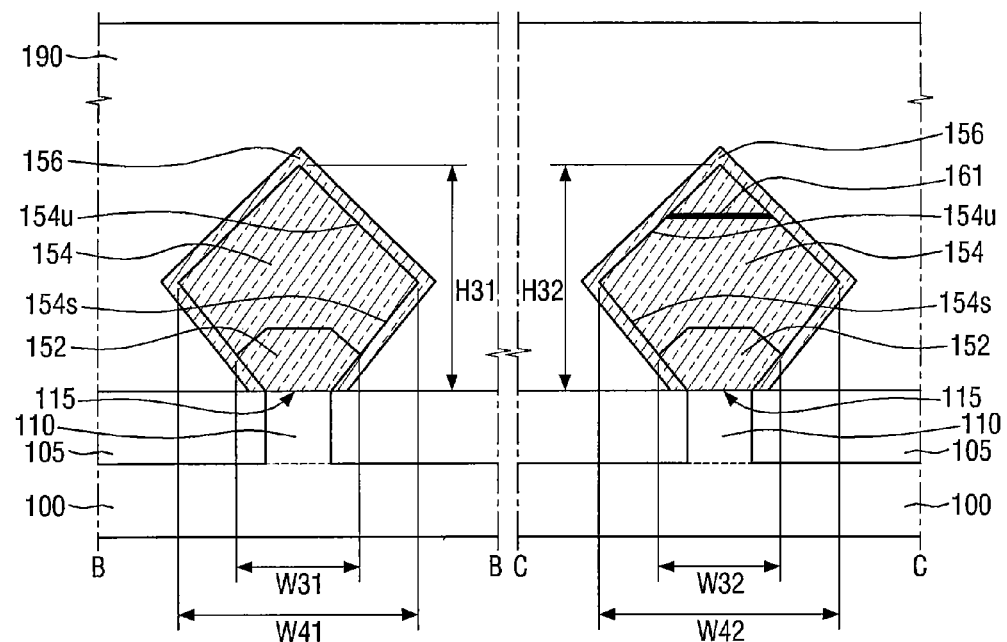
FIG. 7 is a cross-sectional view taken along the lines B-B and C-C of FIG. 1.
Figure 8:
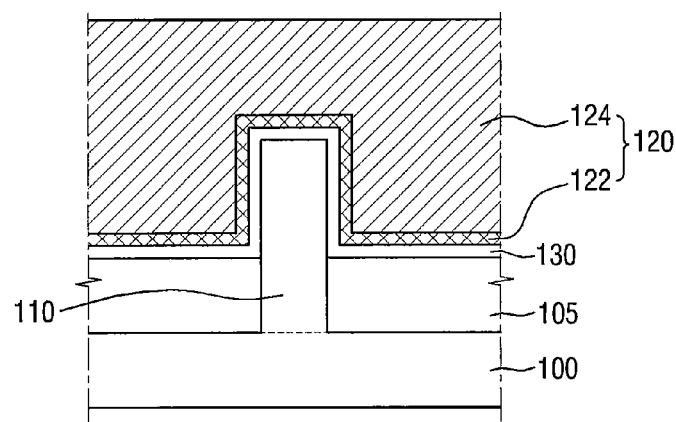
FIG. 8 is a cross-sectional view taken along the line D-D of FIG. 1.

FIG. 1 is a plan view of a semiconductor device 1 according to a first embodiment of the present inventive concept. FIG. 2 is a perspective view of first and second gate electrodes and a first fin-type active pattern 110 illustrated in FIG. 1. FIG. 3 is a cross-sectional view taken along the line A-A of FIG. 1. FIG. 4 is an enlarged view of a region 'P' illustrated in FIG. 3. FIG. 5 is a view excluding a first epitaxial layer 150 from FIG. 4. FIG. 6 is a diagram schematically illustrating the concentration of impurities along a scan line of FIG. 4. FIG. 7 is a cross-sectional view taken along the lines B-B and C-C of FIG. 1. FIG. 8 is a cross-sectional view taken along the line D-D of FIG. 1. For ease of description, an interlayer insulating film 190 is not illustrated in FIG. 1.

For reference, the cross-sectional view of FIG. 7 taken along the line B-B of FIG. 1 is a cross-sectional view of the first epitaxial layer 150 taken at a first position which is at equal distances W1 from the first gate electrode 120 and the second gate electrode 220. In addition, the cross-sectional view of FIG. 7 taken along the line C-C of FIG. 1 is a cross-sectional view of the first epitaxial layer 150 taken at a second position closer to the first gate electrode 120 than the first position.

Referring to FIGS. 1 through 8, the semiconductor device 1 according to the first embodiment of the present inventive concept may include the first fin-type active pattern 110, the first gate electrode 120, the second gate electrode 220, first gate spacers 140, second gate spacers 240, a first trench 115, and the first epitaxial layer 150.

A substrate 100 may be a bulk silicon substrate or a silicon-on-insulator (SOI) substrate. Otherwise, the substrate 100 may be a silicon substrate or may be a substrate made of another material such as silicon germanium, indium antimonide, lead telluride, indium arsenide, indium phosphide, gallium arsenide, and/or gallium antimonide. In some embodiments, the substrate 100 may consist of a base substrate and an epitaxial layer formed on the base substrate.

The first fin-type active pattern 110 may protrude from the substrate 100. A field insulating layer 105 partially covers sidewalls of the first fin-type active pattern 110. Therefore, at least part of the first fin-type active pattern 110 protrudes further upward than the field insulating layer 105. That is, part of a top surface 110a of the first fin-type active pattern 110 protrudes further upward than a top surface of the field insulating layer 105.

The first fin-type active pattern 110 is defined by the field insulating layer 105. The first fin-type active pattern 110 may extend along a first direction X1. The field insulating layer 105 may include one of, but not limited to, an oxide layer, a nitride layer, an oxynitride layer, and/or combinations of the same.

The first fin-type active pattern 110 may be part of the substrate 100 and may include an epitaxial layer grown from the substrate 100. The first fin-type active pattern 110 may include an element semiconductor material such as silicon or germanium. In addition, the first fin-type active pattern 110 may include a compound semiconductor such as a group IV-IV compound semiconductor or a group III-V compound semiconductor. Specifically, the group IV-IV compound semiconductor that forms the first fin-type active pattern 110 may be a binary or ternary compound containing two or more of carbon (C), silicon (Si), germanium (Ge) and/or tin (Sn) and/or a compound obtained by doping the binary or ternary compound with a group IV element. The group III-V compound semiconductor that forms the first fin-type active pattern 110 may be a binary, ternary, or quaternary compound composed of at least one of aluminum (Al), gallium (Ga) and indium (In) (i.e., group III elements) bonded with one of phosphorus (P), arsenic (As) and antimony (Sb) (i.e., group V elements).

Semiconductor devices according to some embodiments of the present inventive concept will hereinafter be described based on the assumption that the first fin-type active pattern 110 is a silicon fin-type active pattern containing silicon.

The first gate electrode 120 may extend along a second direction Y1 to intersect the first fin-type active pattern 110. The first gate electrode 120 may be formed on the first fin-type active pattern 110 and the field insulating layer 105.

The second gate electrode 220 may extend along the second direction Y1 to intersect the first fin-type active pattern 110. The second gate electrode 220 may be formed side by side with the first gate electrode 120. The second gate electrode 220 may be formed on the first fin-type active pattern 110 and the field insulating layer 105.

The first gate electrode 120 and the second gate electrode 220 may be arranged along the first direction X1.

The first gate electrode 120 may include metal layers (122, 124). As illustrated in the drawings, the first gate electrode 120 may be formed by stacking two or more metal layers (122, 124). A first metal layer 122 may control a work function, and a second metal layer 124 may fill a space formed by the first metal layer 122. For example, the first metal layer 122 may include at least one of TiN, TaN, TiC, and/or TaC. In addition, the second metal layer 124 may include W and/or Al. In some embodiments, the first gate electrode 120 may be made of a material (e.g., Si or SiGe) other than metal. The first gate electrode 120 may be formed by, but not limited to, a replacement process.

Like the first gate electrode 120, the second gate electrode 220 may include a third metal layer 222 and a fourth metal layer 224. A description of the second gate electrode 220 may be substantially the same as the description of the first gate electrode 120.

A first gate insulating layer 130 may be formed between the first fin-type active pattern 110 and the first gate electrode 120. The first gate insulating layer 130 may be formed along the sidewalls and top surface of the first fin-type active pattern 110 which protrudes further upward than the field insulating layer 105. In addition, the first gate insulating layer 130 may be formed between the first gate electrode 120 and the field insulating layer 105.

A second gate insulating layer 230 may be formed between the first fin-type active pattern 110 and the second gate electrode 220. The second gate insulating layer 230 may be formed along the sidewalls and top surface of the first fin-type active pattern 110 which protrudes further upward than the field insulating layer 105. In addition, the second gate insulating layer 230 may be formed between the second gate electrode 220 and the field insulating layer 105.

Each of the first gate insulating layer 130 and the second gate insulating layer 230 may include a high-k material having a higher dielectric constant than a silicon oxide layer. For example, each of the first gate insulating layer 130 and the second gate insulating layer 230 may include one or more of, but not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and/or lead zinc niobate.

The first gate spacers 140 may be formed on sidewalls of the first gate electrode 120 extending along the second direction Y1. The second gate spacers 240 may be formed on sidewalls of the second gate electrode 220 extending along the second direction Y1.

Each of the first and second gate spacers 140 and 240 may include at least one of silicon nitride (SiN), silicon oxynitride (SiON), silicon oxide ($SiO_2$), silicon oxycarbonitride (SiOCN), and/or combinations of the same. In the drawings, each of the first and second gate spacers 140 and 240 is illustrated as a single layer. However, the present inventive concept is not limited thereto, and each of the first and second gate spacers 140 and 240 can also have a multilayer structure.

The first trench 115 may be formed between the first gate electrode 120 and the second gate electrode 220. More specifically, the first trench 115 may be formed between a first gate spacer 140 and a second gate spacer 240, which face each other. The first trench 115 is formed in the first fin-type active pattern 110.

In FIGS. 2 and 5, the first trench 115 may include sidewalls 115s and a bottom surface 115b connecting the sidewalls 115s. In the drawings, the bottom surface 115b of the first trench 115 is located at the same level as the top surface of the field insulating layer 105. However, this is merely an example used for ease of description, and the present inventive concept is not limited to this example.

The sidewalls 115s of the first trench 115 are not aligned in a row with a sidewall of the first gate spacers 140 and a sidewall of the second gate spacer 240.

More specifically, an opening 115o of the first trench 115 may be defined in a region where the sidewalls 115s of the first trench 115 are adjacent to a first gate spacer 140 and a second gate spacer 240. In the opening 115o of the first trench 115, a width between the first gate spacer 140 and the second gate spacer 240, which are adjacent one another and face each other, may be smaller than a width between the sidewalls 115s of the first trench 115.

In other words, at least part of a bottom surface of the first gate spacer 140 and/or at least part of a bottom surface of the second gate spacer 240 may be exposed by the opening 115o of the first trench 115. In some embodiments, the first fin-type active pattern 110 may be undercut under the first gate spacer 140 and/or the second gate spacer 240.

In FIG. 5, the first fin-type active pattern 110 is undercut under the first gate spacer 140 and the second gate spacer 240, but the present inventive concept is not limited thereto. In the following description, it will be assumed that at least part of the bottom surface of the first gate spacer 140 and at least part of the bottom surface of the second gate spacer 240 are exposed by the opening 115o of the first trench 115.

A first source/drain region 155 is formed on the first fin-type active pattern 110 between the first gate electrode 120 and the second gate electrode 220. In semiconductor devices according to embodiments of the present inventive concept, the first source/drain region 155 may be a common source/drain region common to the first gate electrode 120 and the second gate electrode 220 formed on a channel region.

The first source/drain region 155 includes the first epitaxial layer 150. An outer circumferential surface of the first epitaxial layer 150 may have various shapes. For example, the outer circumferential surface of the first epitaxial layer 150 may be at least one of a diamond shape, a circular shape, and a rectangular shape. In FIG. 7, a diamond shape (or a pentagonal shape or a hexagonal shape) is illustrated.

The first epitaxial layer 150 may fill the first trench 115. The first epitaxial layer 150 may be formed on the first fin-type active pattern 110. As described above, at least part of the bottom surface of the first gate spacer 140 and at least part of the bottom surface of the second gate spacer 240 are exposed by the opening 115o of the first trench 115. Therefore, the first epitaxial layer 150 may contact at least part of the bottom surface of the first gate spacer 140 and at least part of the bottom surface of the second gate spacer 240.

In the semiconductor device 1 according to the first embodiment of the present inventive concept, the first source/drain region 155 may be an elevated source/drain region. That is, a topmost surface of the first epitaxial layer 150 may protrude further upward than the top surface 110a of the first fin-type active pattern 110.

The first epitaxial layer 150 may include a $(1\_1)^{th}$ boundary surface 150a and a $(1\_2)^{th}$ boundary surface 150b. The $(1\_1)^{th}$ boundary surface 150a may be a portion of the first epitaxial layer 150 which partially contacts the bottom surface of the first gate spacer 140, and the $(1\_2)^{th}$ boundary surface 150b may be a portion of the first epitaxial layer 150 which partially contacts the bottom surface of the second gate spacer 240.

The first epitaxial layer 150 may include a first plane defect 161 and a second plane defect 162 which extend at an angle to the top surface 110a of the first fin-type active pattern 110. The first plane defect 161 may be adjacent the first gate electrode 120, and the second plane defect 162 may be adjacent the second gate electrode 220.

In semiconductor devices according to embodiments of the present inventive concept, each of the first plane defect 161 and the second plane defect 162 may be, for example, a stacking fault.

The first plane defect 161 may extend obliquely from the $(1\_1)^{th}$ boundary surface 150a toward the bottom surface 115b of the first trench 115, that is, toward the substrate 100. The first plane defect 161 may propagate from the $(1\_1)^{th}$ boundary surface 150a between the first epitaxial layer 150 and the bottom surface of the first gate spacer 140 and may be terminated within the first epitaxial layer 150.

The second plane defect 162 may extend obliquely from the $(1\_2)^{th}$ boundary surface 150b toward the bottom surface 115b of the first trench 115, that is, toward the substrate 100. The second plane defect 162 may propagate from the $(1\_2)^{th}$ boundary surface 150b between the first epitaxial layer 150 and the bottom surface of the second gate spacer 240 and may be terminated within the first epitaxial layer 150.

That is, each of the first plane defect 161 and the second plane defect 162 does not penetrate through the first epitaxial layer 150 because it is terminated within the first epitaxial layer 150.

In the semiconductor device 1 according to the first embodiment of the present inventive concept, the first plane defect 161 and the second plane defect 162 extend at an angle to the top surface 110a of the first fin-type active pattern 110 but do not meet each other.

The first plane defect 161 propagates from the $(1\_1)^{th}$ boundary surface 150a, and the second plane defect 162 propagates from the $(1\_2)^{th}$ boundary surface 150b. Therefore, in a thickness direction Z1 of the substrate 100, part of the first plane defect 161 may be overlapped by the first gate spacer 140, and part of the second plane defect 162 may be overlapped by the second gate spacer 240.

In FIG. 4, the first plane defect 161 may include a first point P1 close to the first gate electrode 120 and a second point P2 farther away from the first gate electrode 120 than the first point P1. Here, a first height H1 from the bottom surface 115b of the first trench 115 to the first point P1 is greater than a second height H2 from the bottom surface 115b of the first trench 115 to the second point P2.

This is because the first plane defect 161 propagates from the $(1\_1)^{th}$ boundary surface 150a toward the bottom surface 115b of the first trench 115 at an angle to the top surface 110a of the first fin-type active pattern 110.

The first epitaxial layer 150 may include a first width center CL1 in the first direction X1. That is, the first width center CL1 may be separated from the sidewalls 115s of the first trench 115 by equal distances W2. The second plane defect 162 included in the first epitaxial layer 150 may propagate in a shape corresponding to the shape in which the first plane defect 61 propagates with the first width center CL1 as a center line.

The positional relationship between the first plane defect 161 and the second plane defect 162 will further be described below.

The first height H1 from the bottom surface 115b of the first trench 115, that is, a distance between the first plane defect 161 and the second plane defect 162 at the first point P1 of the first plane defect 161 is a first distance L1. In addition, the second height H2 from the bottom surface 115b of the first trench 115, that is, a distance between the first plane defect 161 and the second plane defect 162 at the second point P2 of the first plane defect 161 is a second distance L2.

In semiconductor devices according to some embodiments of the present inventive concept, the first distance L1 between the first plane defect 161 and the second plane defect 162 at the first point P1 is greater than the second distance L2 between the first plane defect 161 and the second plane defect 162 at the second point P2. That is, the distance between the first plane defect 161 and the second plane defect 162 is reduced from the top surface 110a of the first fin-type active pattern 110 toward the substrate 100.

If the semiconductor device 1 according to the first embodiment of the present inventive concept is ap-channel metal oxide semiconductor (PMOS) transistor, the first epitaxial layer 150 may include a compressive stress material. The compressive stress material may be a material (e.g., SiGe) having a greater lattice constant than Si. The compressive stress material may improve the mobility of carriers in the channel region by applying compressive stress to the first fin-type active pattern 110.

If the semiconductor device 1 according to the first embodiment of the present inventive concept is a PMOS transistor, the first epitaxial layer 150 may include p-type impurities or impurities for preventing the diffusion of the p-type impurities. Impurities included in the first epitaxial layer 150 may include at least one of B, C, In, Ga, and Al.

On the other hand, if the semiconductor device 1 according to the first embodiment of the present inventive concept is an n-channel metal oxide semiconductor (NMOS) transistor, the first epitaxial layer 150 may include a tensile stress material. For example, if the first fin-type active pattern 110 is made of Si, the first epitaxial layer 150 may be made of a material (e.g., SiC) having a smaller lattice constant than Si. The tensile stress material may improve the mobility of carriers in the channel region by applying tensile stress to the first fin-type active pattern 110.

If the semiconductor device 1 according to the first embodiment of the present inventive concept is an NMOS transistor, the first epitaxial layer 150 may include n-type impurities or impurities for preventing the diffusion of the n-type impurities. Impurities included in the first epitaxial layer 150 may include at least one of P, Sb, and As.

In semiconductor devices according to embodiments of the present inventive concept, impurities included in the first epitaxial layer 150 may be piled up around the first plane defect 161 and the second plane defect 162. Since the first plane defect 161 and the second plane defect 162 maintain a high energy state, impurities may gather around the first plane defect 161 and the second plane defect 162.

Referring to the variation in the concentration profile of impurities along the scan line of FIG. 6, the concentration of impurities in a region a around the first plane defect 161 may be higher than the concentration of impurities in a region b outside the region a. That is, when the first epitaxial layer 150 includes a region around the first plane defect 161 and the second plane defect 162 and a region outside the above region, the concentration of impurities in the region around the first plane defect 161 and the second plane defect 162 may be higher than the concentration of impurities in the region outside the above region.

In the semiconductor device 1 according to the first embodiment of the present inventive concept, the first epitaxial layer 150 may include a first lower epitaxial layer 152, a first upper epitaxial layer 154, and a first capping epitaxial layer 156. For example, if the semiconductor device 1 according to the first embodiment of the present inventive concept is a PMOS transistor, the first epitaxial layer 150 may include silicon germanium.

The first lower epitaxial layer 152 and the first upper epitaxial layer 154 may include, for example, silicon germanium. However, silicon germanium in the first lower epitaxial layer 152 and silicon germanium in the first upper epitaxial layer 154 may have different compositions. For example, the proportion of germanium in the first upper epitaxial layer 154 may be higher than the concentration of germanium in the first lower epitaxial layer 152.

The first capping epitaxial layer 156 may include silicon germanium or silicon. When the first capping epitaxial layer 156 includes silicon germanium, the proportion of germanium in the first upper epitaxial layer 154 may be higher than that of germanium in the first lower epitaxial layer 152.

The first lower epitaxial layer 152 is formed along the sidewalls 115s of the first trench 115 and the bottom surface 115b of the first trench 115. The first upper epitaxial layer 154 fills the first trench 115 having the first lower epitaxial layer 152. That is, the first upper epitaxial layer 154 is formed on the first lower epitaxial layer 152. The first capping epitaxial layer 156 may be formed on the first upper epitaxial layer 154 along an outer circumferential surface of the first upper epitaxial layer 154.

In the semiconductor device 1 according to the first embodiment of the present inventive concept, the first lower epitaxial layer 152 may line-contact the bottom surface of the first gate spacer 140 and the bottom surface of the second gate spacer 240 at the top of the sidewalls 115s of the first trench 115. In other words, the first lower epitaxial layer 152 may line-contact each of the first gate spacer 140 and the second gate spacer 240 in the opening 115o of the first trench 115.

Each of the $(1\_1)^{th}$ boundary surface 150a and the $(1\_2)^{th}$ boundary surface 150b included in the first epitaxial layer 150 may be a surface included in the first upper epitaxial layer 154. That is, the first upper epitaxial layer 154 may surface-contact each of the bottom surface of the first gate spacer 140 and the bottom surface of the second gate spacer 240.

Therefore, the first plane defect 161 and the second plane defect 162 may be included not in the first lower epitaxial layer 152 but in the first upper epitaxial layer 154. That is, each of the first plane defect 161 and the second plane defect 162 may start to propagate from the first upper epitaxial layer 154 and may be terminated within the first upper epitaxial layer 154. Each of the first plane defect 161 and the second plane defect 162 may extend not within the first lower epitaxial layer 152 but may be contained within the first upper epitaxial layer 154.

In FIGS. 1 and 7, a width W41 of the first upper epitaxial layer 154 in the second direction Y1 from the first position which is at equal distances from the first gate electrode 120 and the second gate electrode 220 may be substantially equal to a width W42 of the first upper epitaxial layer 154 in the second direction Y1 at the second position closer to the first gate electrode 120 than the first position. Here, when the first upper epitaxial layer 154 has "equal widths" at two compared positions, the widths may be completely the same or may have a fine difference between them due to, e.g., process margin.

A height H31 from the first fin-type active pattern 110 to a topmost portion of the first upper epitaxial layer 154 at the first position which is at equal distances from the first gate electrode 120 and the second gate electrode 220 may be substantially equal to a height H32 from the first fin-type active pattern 110 to the topmost portion of the first upper epitaxial layer 154 at the second position which is closer to the first gate electrode 120 than the first position.

In addition, a width W31 of the first lower epitaxial layer 152 in the second direction Y1 at the first position which is at equal distances from the first gate electrode 120 and the second gate electrode 220 may be substantially equal to a width W32 of the first lower epitaxial layer 152 in the second direction Y1 at the second position which is closer to the first gate electrode 120 than the first position.

The first capping epitaxial layer 156 formed on a top surface 154u of the first upper epitaxial layer 154 may have substantially equal thicknesses at the first position and the second position. Here, when the first capping epitaxial layer 156 has "equal thicknesses" at two compared positions, the thicknesses may be completely the same or may have a fine difference between them due to, e.g., process margin Referring to the right side of FIG. 7, the first epitaxial layer 150 includes the first plane defect 161. A height at which the first plane defect 161 is located may become farther away from the first fin-type active pattern 110 as the distance to the first gate electrode 120 decreases and may become closer to the first fin-type active pattern 110 as the distance to the first position decreases.

In addition, referring to the right side of FIG. 7, the first plane defect 161 may become narrower as the distance to the first gate electrode 120 decreases and may become wider as the distance to the first position decreases.

The mechanism behind the generation of the first plane defect 161 and the second plane defect 162 will now be described with reference to FIG. 4.

For example, growing in the thickness direction Z1 of the substrate 100 may be to grow in a <100> direction of the first epitaxial layer 150, and growing in a direction toward the sidewalls 115s of the first trench 115 may be to grow in a <110> direction of the first epitaxial layer 150.

The first lower epitaxial layer 152 may be formed along the sidewalls 115s of the first trench 115 and the bottom surface 115b of the first trench 115. The sidewalls 115s of the first trench 115 and the bottom surface 115b of the first trench 115 may be exposed surfaces of the first fin-type active pattern 110 and thus serve as a seed layer on which the first lower epitaxial layer 152 can grow.

After the formation of the first lower epitaxial layer 152, the first upper epitaxial layer 154 is grown. The growth speed of the first upper epitaxial layer 154 in the <100> direction and the growth speed of the first upper epitaxial layer 154 in the <110> direction can be adjusted.

That is, under epitaxial growth conditions in which the growth speed of the first upper epitaxial layer 154 in the <110> direction increases, it is possible to prevent compressive stress from being relieved at the boundary between the first lower epitaxial layer 152 and the first upper epitaxial layer 154 during the growth of the first upper epitaxial layer 154.

However, as the first upper epitaxial layer 154 grows in the <110> direction, stacking faults, i.e., the first plane defect 161 and the second plane defect 162 may be generated due to a lattice mismatch between the first upper epitaxial layer 154 and the bottom surface of the first gate spacer 140 and between the first upper epitaxial layer 154 and the bottom surface of the second gate spacer 240. This is because the bottom surface of the first gate spacer 140 and the bottom surface of the second gate spacer 240 cannot serve as seed layers for epitaxial growth.

As the first upper epitaxial layer 154 grows, the first plane defect 161 and the second plane defect 162 propagate along a closed packed plane. If the first upper epitaxial layer 154 is silicon germanium, the first plane defect 161 and the second plane defect 162 may propagate along a {111} group because the closed packed plane of silicon germanium is the {111} group. That is, each of the first plane defect 161 and the second plane defect 162 may propagate at an angle of 54.7° to the top surface 110a of the first fin-type active pattern 110.

Through the above process, the first epitaxial layer 150 may include the first plane defect 161 and the second plane defect 162, which respectively start from the $(1\_1)^{th}$ boundary surface 150a and the $(1\_2)^{th}$ boundary surface 150b and are at an angle to the top surface 110a of the first fin-type active pattern 110.

Accordingly, since the compressive stress applied to the channel region of the first fin-type active pattern 110 by the first epitaxial layer 150 is not relieved, the performance of the semiconductor device 1 can be improved.

Figure 9:
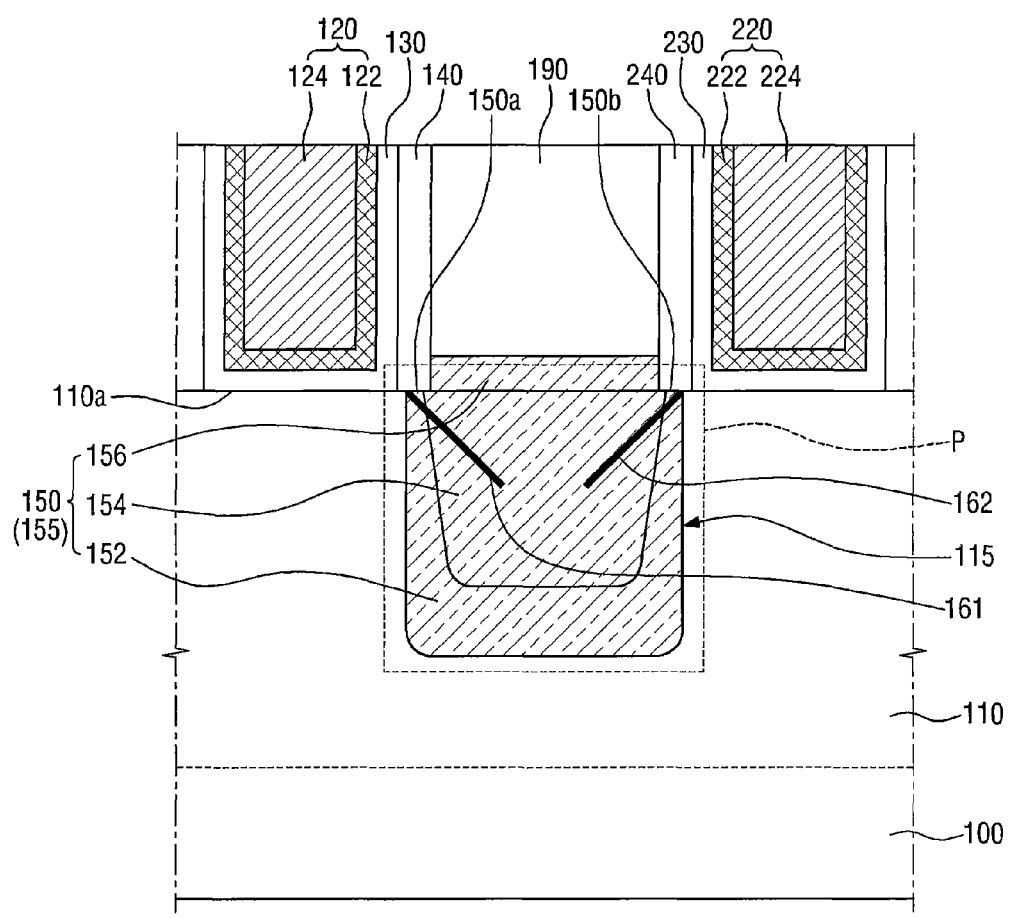
FIGS. 9 and 10 are views of a semiconductor device according to a second embodiment of the present inventive concept.
Figure 10:
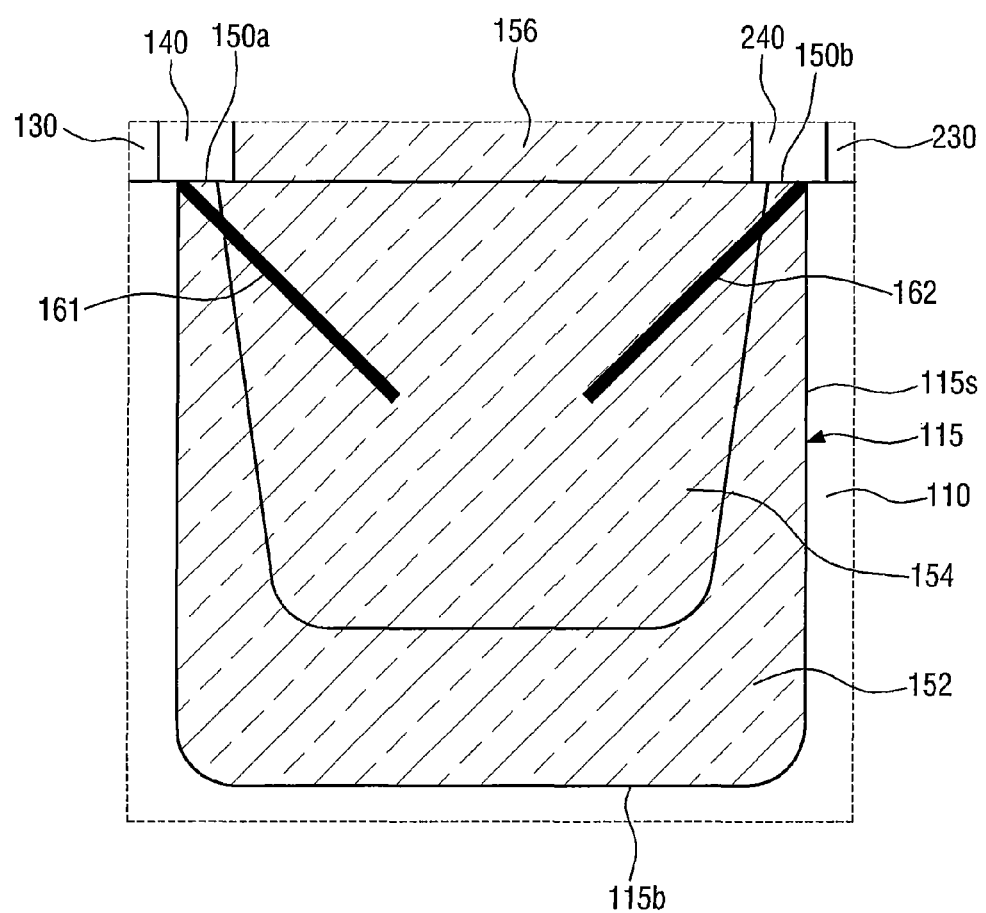

FIGS. 9 and 10 are views of a semiconductor device 2 according to a second embodiment of the present inventive concept. For simplicity, the current embodiment will hereinafter be described, focusing mainly on differences with the embodiment of FIGS. 1 through 8.

Referring to FIGS. 9 and 10, in the semiconductor device 2 according to the second embodiment of the present inventive concept, a first lower epitaxial layer 152 may surface-contact a bottom surface of a first gate spacer 140 and a bottom surface of a second gate spacer 240 at the top of sidewalls 115s of a first trench 115.

In other words, the first lower epitaxial layer 152 may surface-contact each of the first gate spacer 140 and the second gate spacer 240 in an opening 115o of the first trench 115.

Each of at least part of a $(1\_1)^{th}$ boundary surface 150a included in a first epitaxial layer 150 and at least part of a $(1\_2)^{th}$ boundary surface 150b included in the first epitaxial layer 150 may be a surface included in the first lower epitaxial layer 152.

In the semiconductor device 2 according to the second embodiment of the present inventive concept, each of a first plane defect 161 and a second plane defect 162 may be included in the first lower epitaxial layer 152 and a first upper epitaxial layer 154. In other words, the first plane defect 161 and the second plane defect 162 may start to propagate from the first lower epitaxial layer 152 and may be terminated within the first upper epitaxial layer 154. That is, the first plane defect 161 may start from the $(1\_1)^{th}$ boundary surface 150a at which the first lower epitaxial layer 152 and the bottom surface of the first gate spacer 140 contact each other, and the second plane defect 162 may start from the $(1\_2)^{th}$ boundary surface 150b at which the first lower epitaxial layer 152 and the bottom surface of the second gate spacer 240 contact each other.

The first plane defect 161 and the second plane defect 162 may pass through the first lower epitaxial layer 152 and the first upper epitaxial layer 154 to be terminated within the first upper epitaxial layer 154.

Figure 11:
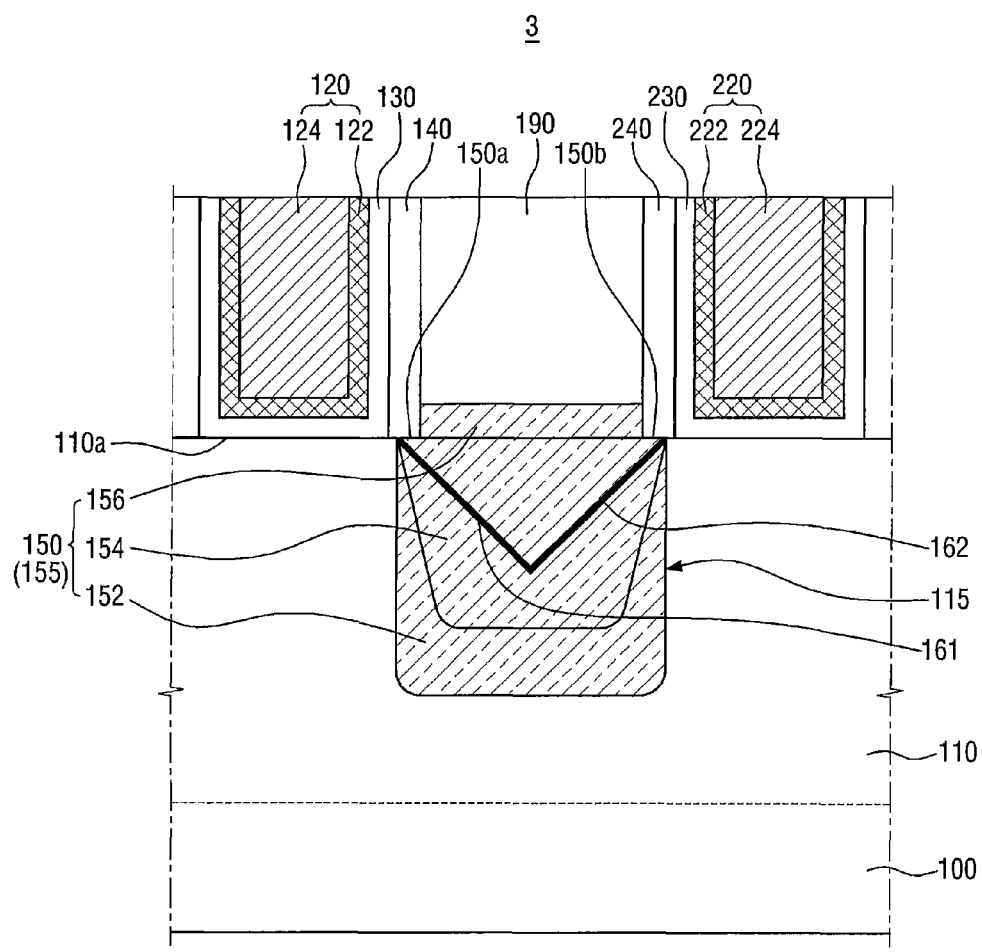
FIG. 11 is a view of a semiconductor device according to a third embodiment of the present inventive concept.

FIG. 11 is a view of a semiconductor device 3 according to a third embodiment of the present inventive concept. For simplicity, the current embodiment will hereinafter be described, focusing mainly on differences with the embodiment of FIGS. 1 through 8.

Referring to FIG. 11, in the semiconductor device 3 according to the third embodiment of the present inventive concept, a first plane defect 161 and a second plane defect 162 may meet each other.

That is, the first plane defect 161 which extends from a $(1\_1)^{th}$ boundary surface 150a toward a bottom surface of a first trench 115 at an angle to a top surface 110a of a first fin-type active pattern 110 and the second plane defect 162 which extends from a $(1\_2)^{th}$ boundary surface 150b toward the bottom surface of the first trench 115 at an angle to the top surface 110a of the first fin-type active pattern 110 may meet each other.

The first plane defect 161 and the second plane defect 162 may meet each other at a central portion of a first epitaxial layer 150. In addition, the first plane defect 161 and the second plane defect 162 may meet each other within a first upper epitaxial layer 154.

In the semiconductor device 3 according to the third embodiment of the present inventive concept, the first plane defect 161 and the second plane defect 162 may be terminated at a position where the first plane defect 161 and the second plane defect 162 meet each other. The first plane defect 161 and the second plane defect 162 may meet each other to form, e.g., a "V" shape.

However, the present inventive concept is not limited thereto, and the first plane defect 161 and the second plane defect 162 can extend further even after meeting each other.

Figure 12:
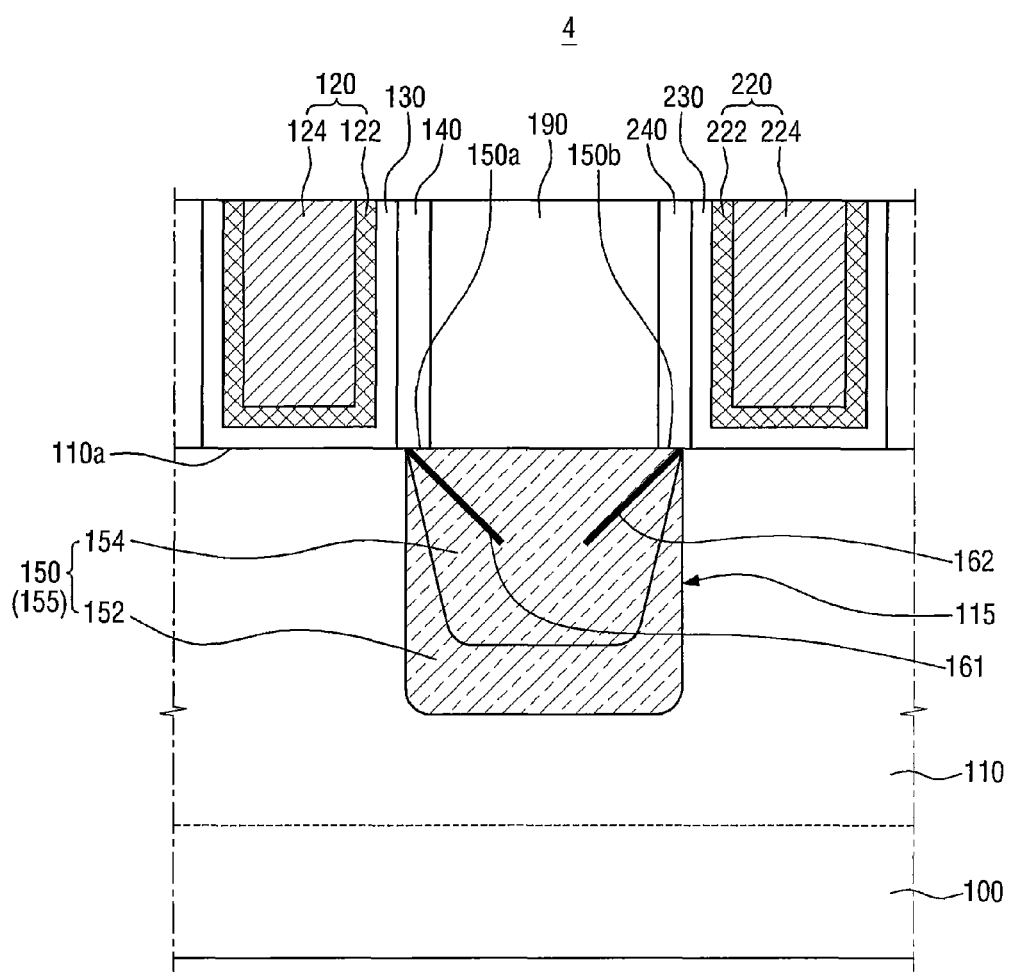
FIG. 12 is a view of a semiconductor device according to a fourth embodiment of the present inventive concept.

FIG. 12 is a view of a semiconductor device 4 according to a fourth embodiment of the present inventive concept. For simplicity, the current embodiment will hereinafter be described, focusing mainly on differences with the embodiment of FIGS. 1 through 8.

Referring to FIG. 12, the semiconductor device 4 according to the fourth embodiment of the present inventive concept may not include a first capping epitaxial layer 156.

That is, a first epitaxial layer 150 may include a first lower epitaxial layer 152 and a first upper epitaxial layer 154 and may not include the first capping epitaxial layer 156 formed along a top surface and sidewalls of the first upper epitaxial layer 154.

A top surface of a first source/drain region 155 including the first epitaxial layer 150 may be at the same level as a top surface 110a of a first fin-type active pattern 110. The first source/drain region 155 may not be an elevated source/drain region.

Figure 13:
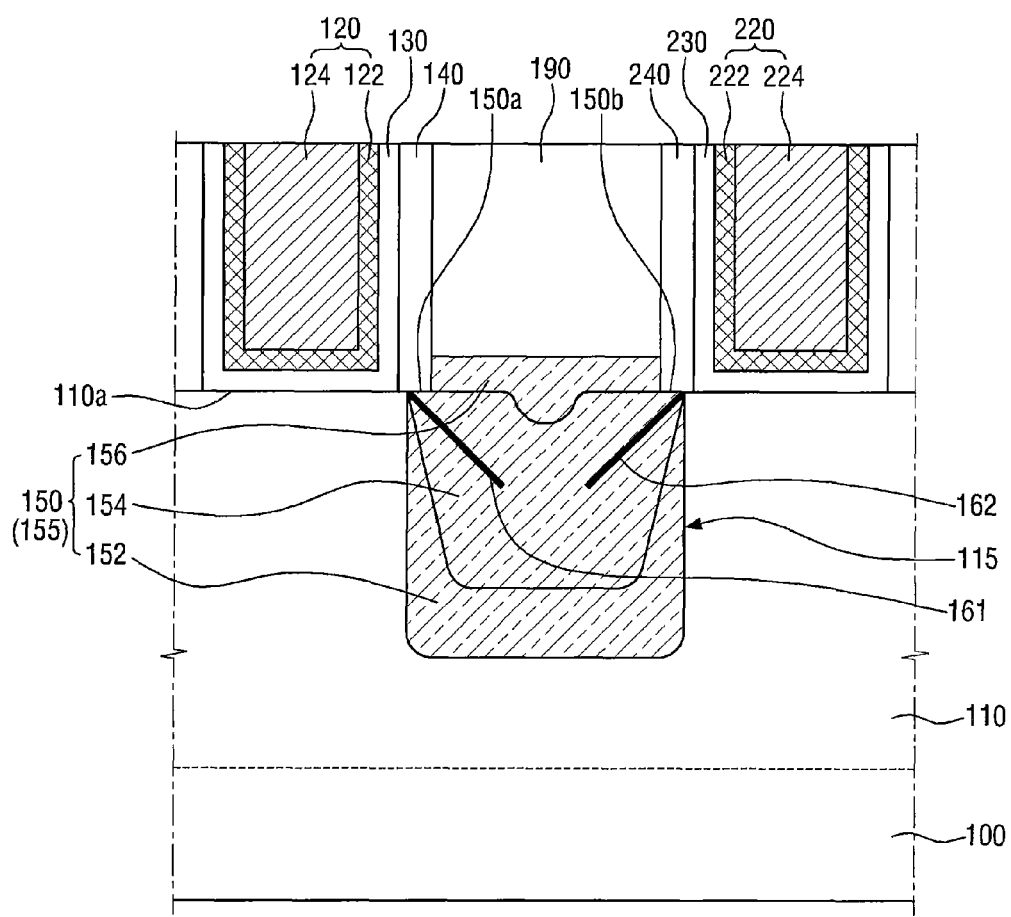
FIGS. 13 and 14 are views of a semiconductor device according to a fifth embodiment of the present inventive concept.
Figure 14:
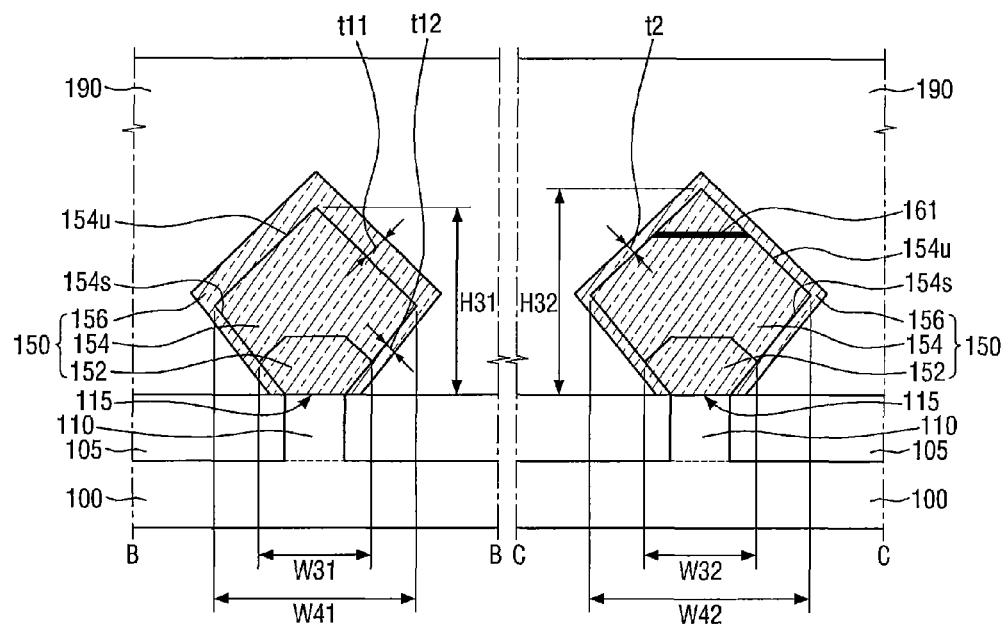

FIGS. 13 and 14 are views of a semiconductor device 5 according to a fifth embodiment of the present inventive concept. For simplicity, the current embodiment will hereinafter be described, focusing mainly on differences with the embodiment of FIGS. 1 through 8.

Referring to FIGS. 13 and 14, in the semiconductor device 5 according to the fifth embodiment of the present inventive concept, a height of a first upper epitaxial layer 154 at a midpoint between a first gate electrode 120 and a second gate electrode 220 may be smaller than a height of the first upper epitaxial layer 154 at a point where the first upper epitaxial layer 154 meets a first gate spacer 140 or a second gate spacer 240.

More specifically, a height H31 from a bottom surface of a first trench 115 to a topmost portion of the first upper epitaxial layer 154 at a first position which is at equal distances from the first gate electrode 120 and the second gate electrode 220 may be smaller than a height H32 from the bottom surface of the first trench 115 to the topmost portion of the first upper epitaxial layer 154 at a second position which is closer to the first gate electrode 120 than the first position.

In other words, the topmost portion of the first upper epitaxial layer 154 may be more recessed than the top surface 110a of the first fin-type active pattern 110 at the first position which is at equal distances from the first gate electrode 120 and the second gate electrode 220.

In addition, in the semiconductor device 5 according to the fifth embodiment of the present inventive concept, a width W41 of the first upper epitaxial layer 154 in a second direction Y1 at the first position which is at equal distances from the first gate electrode 120 and the second gate electrode 220 may be smaller than a width W42 of the first upper epitaxial layer 154 in the second direction Y2 at the second position which is closer to the first gate electrode 120 than the first position.

However, a width W31 of a first lower epitaxial layer 152 in the second direction Y1 at the first position which is at equal distances from the first gate electrode 120 and the second gate electrode 220 may be substantially equal to a width W32 of the first lower epitaxial layer 152 in the second direction Y2 at the second position which is closer to the first gate electrode 120 than the first position.

That is, as the first upper epitaxial layer 154 grows, a height and width of the first upper epitaxial layer 154 at the first position may become smaller than a height and width of the first upper epitaxial layer 154 at the second position.

Further, a thickness t11 of a first capping epitaxial layer 156 formed on a top surface 154u of the first upper epitaxial layer 154 at the first position which is at equal distances from the first gate electrode 120 and the second gate electrode 220 may be greater than a thickness t11 of the first capping epitaxial layer 156 formed on the top surface 154u of the first upper epitaxial layer 154 at the second position which is closer to the first gate electrode 120 than the first position.

Since the height H31 from the bottom surface of the first trench 115 to the topmost portion of the first upper epitaxial layer 154 at the first position is smaller than the height H32 from the bottom surface of the first trench 115 to the topmost portion of the first upper epitaxial layer 154 at the second position, the thickness t11 of the first capping epitaxial layer 156 formed on the top surface 154u of the first upper epitaxial layer 154 at the first position may be greater than the thickness t2 of the first capping epitaxial layer 156 formed on the top surface 154u of the first upper epitaxial layer 154 at the second position.

In the semiconductor device 5 according to the fifth embodiment of the present inventive concept, the thickness t12 of the first capping epitaxial layer 156 formed on sidewalls 154s of the first upper epitaxial layer 154 may be smaller than the thickness t11 of the first capping epitaxial layer 156 formed on the top surface 154u of the first upper epitaxial layer 154 at the first position which is at equal distances from the first gate electrode 120 and the second gate electrode 220.

Figure 15:
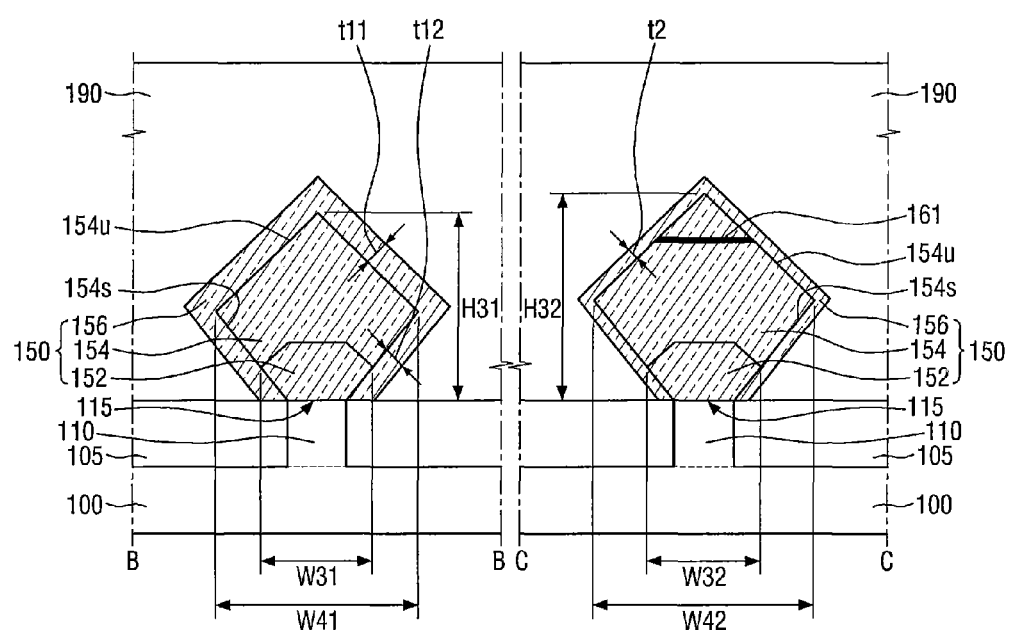
FIG. 15 is a view of a semiconductor device according to a sixth embodiment of the present inventive concept.

FIG. 15 is a view of a semiconductor device 6 according to a sixth embodiment of the present inventive concept. For simplicity, the current embodiment will hereinafter be described, focusing mainly on differences with the embodiment of FIGS. 13 and 14.

Referring to FIG. 15, a first capping epitaxial layer 156 may be conformally formed on sidewalls 154s of a first upper epitaxial layer 154 and a top surface 154u of the first upper epitaxial layer 154 at a first position which is at equal distances from a first gate electrode 120 and a second gate electrode 220.

In other words, a thickness t12 of the first capping epitaxial layer 156 formed on the sidewalls 154s of the first upper epitaxial layer 154 may be substantially equal to a thickness t11 of the first capping epitaxial layer 156 formed on the top surface 154u of the first upper epitaxial layer 154.

A difference between the thickness t12 of the first capping epitaxial layer 156 formed on the sidewalls 154s of the first upper epitaxial layer 154 and the thickness t11 of the first capping epitaxial layer 156 formed on the top surface 154u of the first upper epitaxial layer 154 may result from a diffusion length of an element supplied to grow the first capping epitaxial layer 156 between a field insulating layer 105 and the first upper epitaxial layer 154.

That is, in FIGS. 14 and 15, a top surface of the field insulating layer 105 is flat. However, the present inventive concept is not limited thereto. The top surface of the field insulating layer 105 may protrude at a portion that contacts a first fin-type active pattern 110. That is, the field insulating layer 105 may be thickest at the portion that contacts the first fin-type active pattern 110.

The diffusion length of the element supplied to grow the first capping epitaxial layer 156 may vary according to the shape of the top surface of the field insulating layer 105 around a region in which a first epitaxial layer 150 grows. Accordingly, this may cause the difference between the thickness t12 of the first capping epitaxial layer 156 formed on the sidewalls 154s of the first upper epitaxial layer 154 and the thickness t11 of the first capping epitaxial layer 156 formed on the top surface 154u of the first upper epitaxial layer 154.

Figure 16:
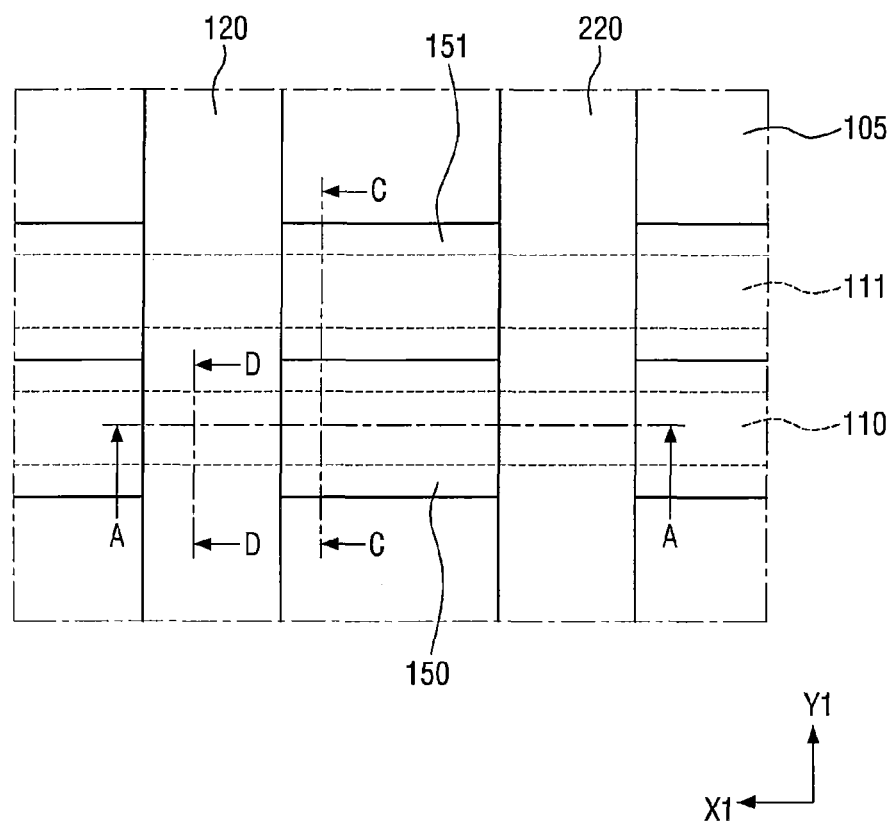
FIG. 16 is a plan view of a semiconductor device according to a seventh embodiment of the present inventive concept.
Figure 17:
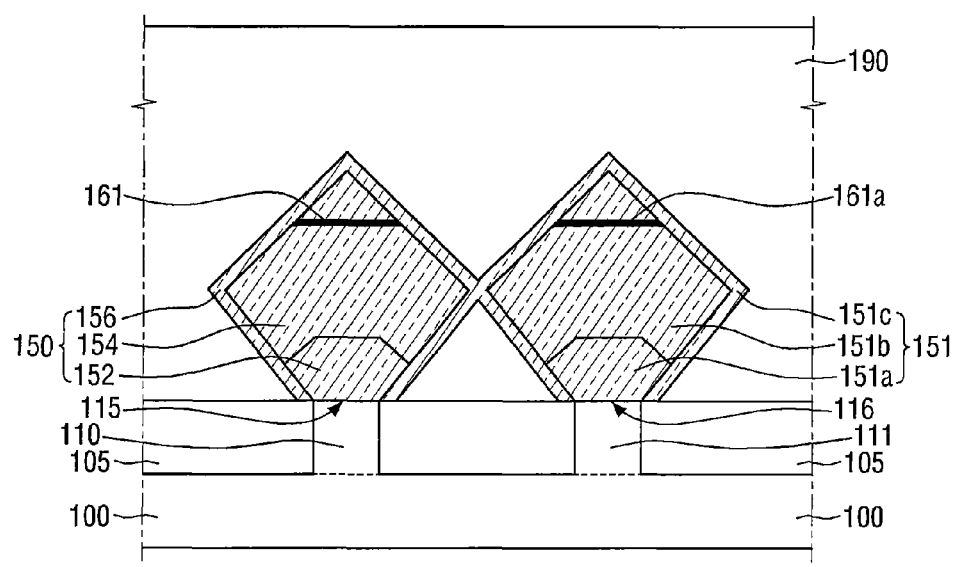
FIG. 17 is a cross-sectional view taken along the line C-C of FIG. 16.

FIG. 16 is a plan view of a semiconductor device 7 according to a seventh embodiment of the present inventive concept. FIG. 17 is a cross-sectional view taken along the line C-C of FIG. 16. For simplicity, the current embodiment will hereinafter be described, focusing mainly on differences with the embodiment of FIGS. 1 through 8.

Referring to FIGS. 16 and 17, the semiconductor device 7 according to the seventh embodiment of the present inventive concept may further include a $(1\_1)^{th}$ fin-type active pattern 111, a $(1\_1)^{th}$ trench 116, and a $(1\_1)^{th}$ epitaxial layer 151.

The $(1\_1)^{th}$ fin-type active pattern 111 may protrude from a substrate 100. At least part of the $(1\_1)^{th}$ fin-type active pattern 111 may protrude further upward than a field insulating layer 105. The $(1\_1)^{th}$ fin-type active pattern 111 may be defined by the field insulating layer 105 and may extend along a first direction X1.

The $(1\_1)^{th}$ fin-type active pattern 111 may extend side by side with a first fin-type active pattern 110 along a lengthwise direction. More specifically, long sides of the $(1\_1)^{th}$ fin-type active pattern 111 may face long sides of the first fin-type active pattern 110. The first fin-type active pattern 110 and the $(1\_1)^{th}$ fin-type active pattern 111 may be arranged along a second direction Y1.

A first gate electrode 120 and a second gate electrode 220 may be formed on the $(1\_1)^{th}$ fin-type active pattern 111 to intersect the $(1\_1)^{th}$ fin-type active pattern 111.

The $(1\_1)^{th}$ trench 116 may be formed between the first gate electrode 120 and the second gate electrode 220. The $(1\_1)^{th}$ trench 116 is formed in the $(1\_1)^{th}$ fin-type active pattern 111.

The $(1\_1)^{th}$ epitaxial layer 151 may fill the $(1\_1)^{th}$ trench 116 and may be formed on the $(1\_1)^{th}$ fin-type active pattern 111. As illustrated on the right side of FIG. 17, the $(1\_1)^{th}$ epitaxial layer 151 may include a $(1\_1)^{th}$ plane defect 161a.

In the semiconductor device 7 according to the seventh embodiment of the present inventive concept, a first epitaxial layer 150 and the $(1\_1)^{th}$ epitaxial layer 151 may contact each other. That is, the first epitaxial layer 150 and the $(1\_1)^{th}$ epitaxial layer 151 may be directly connected to each other.

In FIG. 17, the first epitaxial layer 150 and the $(1\_1)^{th}$ epitaxial layer 151 are connected to each other since a first capping epitaxial layer 156 and a $(1\_1)^{th}$ capping epitaxial layer 151c stick to each other. However, the present inventive concept is not limited thereto.

Figure 18:
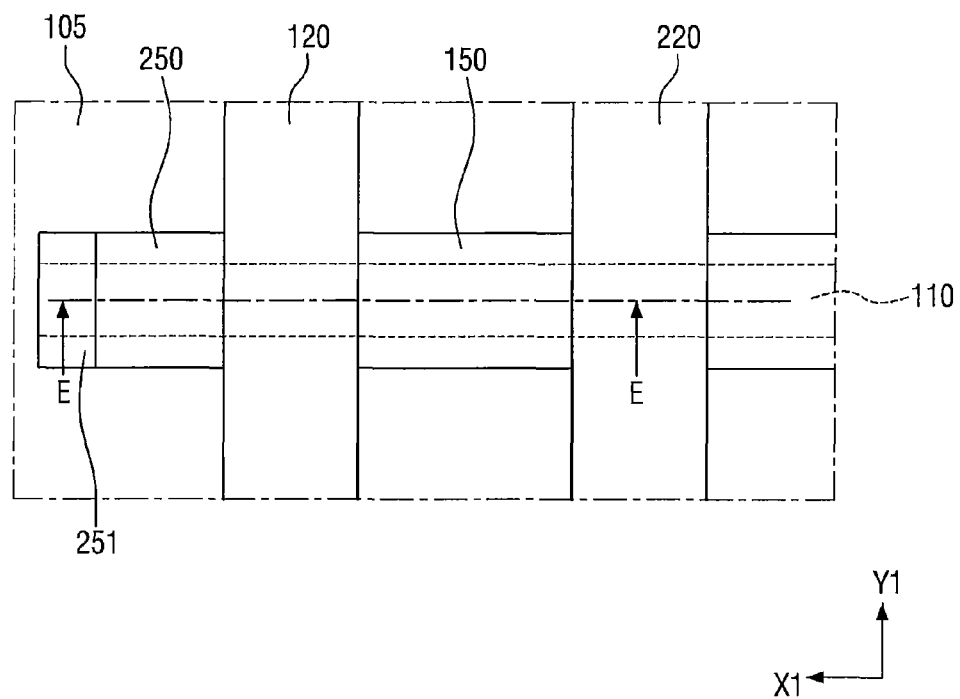
FIG. 18 is a plan view of a semiconductor device according to an eighth embodiment of the present inventive concept.
Figure 19:
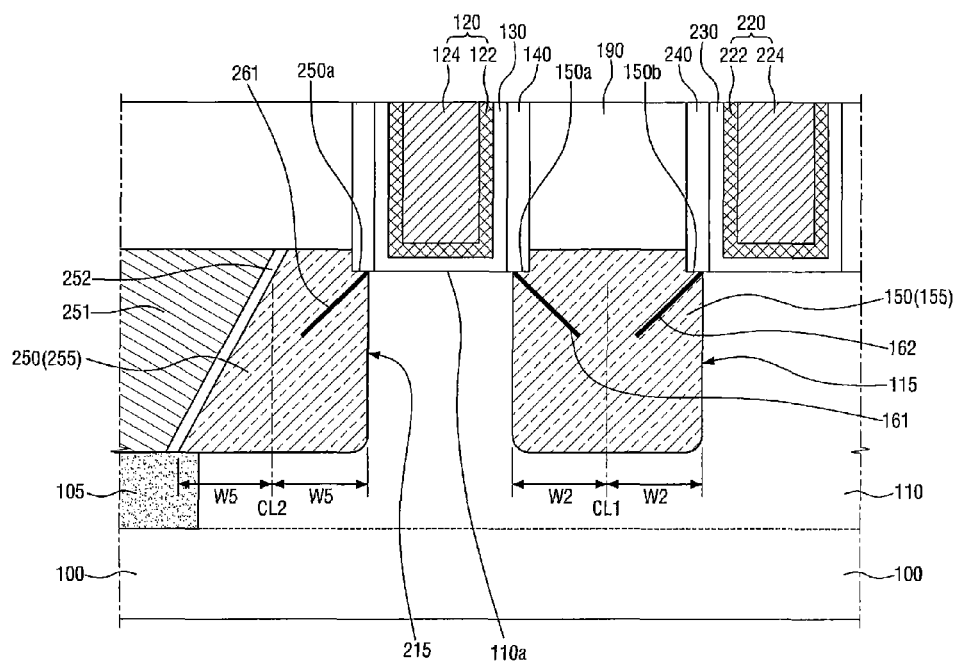
FIG. 19 is a cross-sectional view taken along the line E-E of FIG. 18.

FIG. 18 is a plan view of a semiconductor device 8 according to an eighth embodiment of the present inventive concept. FIG. 19 is a cross-sectional view taken along the line E-E of FIG. 18. For simplicity, the current embodiment will hereinafter be described, focusing mainly on differences with the embodiment of FIGS. 1 through 8.

For reference, a case where an epitaxial layer includes not a plurality of layers but one layer will hereinafter be described. However, this is merely an example used for ease of description, and the present inventive concept is not limited to this example.

Referring to FIGS. 18 and 19, the semiconductor device 8 according to the eighth embodiment of the present inventive concept further includes a second trench 215 and a second epitaxial layer 250.

The second trench 215 is formed in a first fin-type active pattern 110. Since the second trench 215 is formed at an end of the first fin-type active pattern 110, it may include one sidewall and a bottom surface which are exposed portions of the first fin-type active pattern 110.

The sidewall of the second trench 215 and a sidewall of a first gate spacer 140 are not aligned in a row with each other. That is, like a first trench 115, the first fin-type active pattern 110 is undercut under the first gate spacer 140. That is, at least part of a bottom surface of the first gate spacer 140 may be exposed by the second trench 215.

The first trench 115 is formed on a side of a first gate electrode 120, and the second trench 215 is formed on the other side of the first gate electrode 120.

In the semiconductor device 8 according to the eighth embodiment of the present inventive concept, the first gate electrode 120 and a second gate electrode 220 are located on both sides of the first trench 115. The first gate electrode 120 is located on a side of the second trench 215, but no gate electrode is located on the other side of the second trench 215.

A second source/drain region 255 is formed on an opposite side of the first gate electrode 120 from a first source/drain region 155. Unlike the first source/drain region 155, the second source/drain region 255 may not be a common source/drain region shard by two gate electrodes.

The second source/drain region 255 includes the second epitaxial layer 250. The second epitaxial layer 250 may fill the second trench 215. The second epitaxial layer 250 is formed on the first fin-type active pattern 110 and at an end of the first fin-type active pattern 110.

The second epitaxial layer 250 may include a $(2\_1)^{th}$ boundary surface 250a. The $(2\_1)^{th}$ boundary surface 250a may be a portion that partially contacts the bottom surface of the first gate spacer 140.

The second epitaxial layer 250 may include a third plane defect 261 which extends at an angle to a top surface 110a of the first fin-type active pattern 110. The third plane defect 261 may be, for example, a stacking fault.

The third plane defect 261 may extend obliquely from the $(2\_1)^{th}$ boundary surface 250a toward the bottom surface of the second trench 215, that is, toward a substrate 100. The third plane defect 261 may propagate from the $(2\_1)^{th}$ boundary surface 250a between the second epitaxial layer 250 and the bottom surface of the first gate spacer 140 and may be terminated within the second epitaxial layer 250.

Since the third plane defect 261 is terminated within the second epitaxial layer 250, it does not penetrate through the second epitaxial layer 250.

In addition, since the third plane defect 261 propagates from the $(2\_1)^{th}$ boundary surface 250a, part of the third plane defect 261 may be overlapped by the first gate spacer 140 in a thickness direction Z1 of the substrate 100.

The second epitaxial layer 250 may include a second width center CL2 in a first direction X1. That is, the second width center CL2 may be a center line in a center of a width of the second epitaxial layer 250 in the first direction X1. The second width center CL2 may be separated from the sidewall of the second trench 215 by W5.

In the semiconductor device 8 according to the eighth embodiment of the present inventive concept, the second epitaxial layer 250 does not include a plane defect which propagates in a shape corresponding to a shape in which the third plane defect 261 propagates with respect to the second width center CL2. The first fin-type active pattern 110 is located on a side of the second epitaxial layer 250 and serves as a seed layer for growing the second epitaxial layer 250. However, no semiconductor material layer serving as a seed layer is located on the other side of the second epitaxial layer 250. Therefore, the second epitaxial layer 250 does not include a plane defect which propagates in a shape corresponding to the shape in which the third plane defect 261 propagates with respect to the second width center CL2.

Some embodiments include an isolation region 251 that is formed in the fin-type pattern in the second direction and that is arranged in the first direction relative first and second gate electrodes 120, 220. Some embodiments provide that a spacer 252 is formed on a sidewall of the isolation region 251. In some embodiments, the spacer 252 may be configured to include a portion that extends beyond a sidewall of the second trench 215. In some embodiments, the second epitaxial layer 250 is between the first electrode 120 and the isolation region 251. Some embodiments provide that the isolation region 251 is a shallow trench isolation (STI) region. Although described in the context of the eighth embodiment, the isolation region 251 and/or spacer 252 may be included in any embodiments of the present disclosure.

Figure 20:
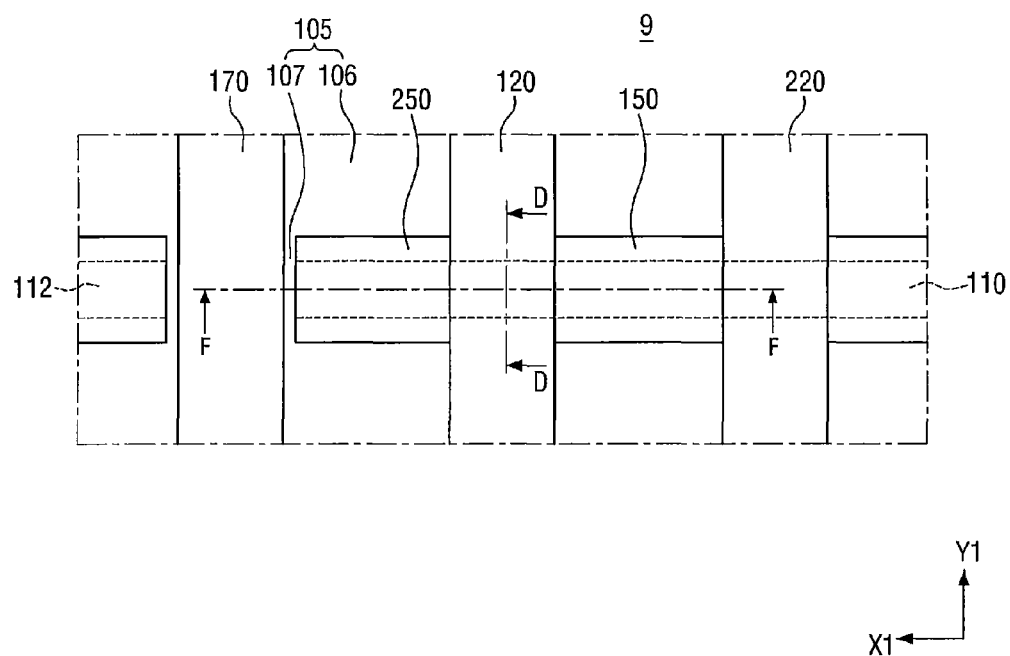
FIG. 20 is a plan view of a semiconductor device according to a ninth embodiment of the present inventive concept.
Figure 21:
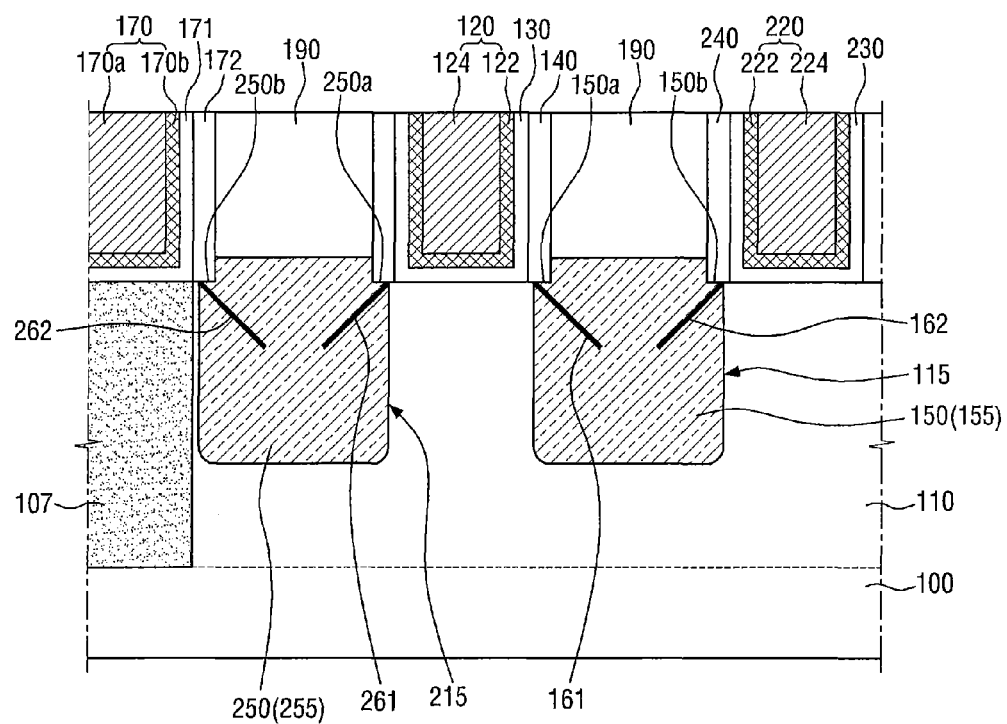
FIG. 21 is a cross-sectional view taken along the line F-F of FIG. 20.

FIG. 20 is a plan view of a semiconductor device 9 according to a ninth embodiment of the present inventive concept. FIG. 21 is a cross-sectional view taken along the line F-F of FIG. 20. For simplicity, the current embodiment will hereinafter be described, focusing mainly on differences with the embodiment of FIGS. 1 through 8.

For reference, a cross-sectional view taken along the line D-D of FIG. 20 is substantially the same as FIG. 8. In FIG. 8, the field insulating layer 105 partially covering the sidewalls of the first fin-type active pattern 110 may be a first region 106 of a field insulating layer 105 in FIG. 20.

Referring to FIGS. 20 and 21, the semiconductor device 9 according to the ninth embodiment of the present inventive concept includes a second trench 215, a second epitaxial layer 250, and a first dummy gate electrode 170.

The field insulating layer 105 that defines a first fin-type active pattern 110 may include the first region 106 and a second region 107. The first region 106 of the field insulating layer 105 may contact long sides of the first fin-type active pattern 110, and the second region 107 of the field insulating layer 105 may contact short sides of the first fin-type active pattern 110.

In FIG. 21, a top surface of the second region 107 of the field insulating layer 105 which contacts the short sides of the first fin-type active pattern 110 may be side by side with a top surface 110a of the first fin-type active pattern 110 or may be higher than the top surface 110a of the first fin-type active pattern 110. However, the present inventive concept is not limited thereto. That is, the top surface of the second region 107 of the field insulating layer 105 can be disposed between a top surface of the first region 106 of the field insulating layer 105 and the top surface 110a of the first fin-type active pattern 110.

The first dummy gate electrode 170 is formed on the second region 107 of the field insulating layer 105 to extend along a second direction Y1. The first dummy gate electrode 170 may include a first dummy metal layer 170a and a second dummy metal layer 170b. A description of the first dummy gate electrode 170 may be substantially the same as the description of a first gate electrode 120 and thus will be omitted.

First dummy gate spacers 172 may be formed on sidewalls of the first dummy gate electrode 170 which extends along the second direction Y1. In the semiconductor device 9 according to the ninth embodiment of the present inventive concept, a first dummy gate spacer 172 formed on a side of the first dummy gate electrode 170 may be disposed on the first fin-type active pattern 110. That is, at least part of the first dummy gate spacer 172 may overlap the first fin-type active pattern 110.

The second trench 215 may be formed between the first gate electrode 120 and the first dummy gate electrode 170. More specifically, the second trench 215 may be formed between a first gate spacer 140 and a first dummy gate spacer 172 which face each other.

The second trench 215 is formed within the first fin-type active pattern 110. The second trench 215 is formed at an end of the first fin-type active pattern 110 but may include two sidewalls and a bottom surface which are exposed portions of the first fin-type active pattern 110. That is, the second region 107 of the field insulating layer 105 is not exposed by the second trench 215.

A sidewall of the second trench 215 and a sidewall of the first gate spacer 140 are not aligned in a row with each other, and the other sidewall of the second trench 215 and a sidewall of the first dummy gate spacer 172 are not aligned in a row with each other. The first fin-type active pattern 110 may be undercut under the first gate spacer 140 and the first dummy gate spacer 172.

A second source/drain region 255 is formed on the first fin-type active pattern 110 between the first gate electrode 120 and the first dummy gate electrode 170. Unlike a first source/drain region 155, the second source/drain region 255 may not be a common source/drain region shared by two gate electrodes.

The second source/drain region 255 includes the second epitaxial layer 250. The second epitaxial layer 250 may fill the second trench 215. The second epitaxial layer 250 is formed on the first fin-type active pattern 110 and at an end of the first fin-type active pattern 110.

Since the second region 107 of the field insulating layer 105 is not exposed by the second trench 215, part of the first fin-type active pattern 110 is interposed between the second region 107 of the field insulating layer 105 and the second epitaxial layer 250.

The second epitaxial layer 250 may include a $(2\_1)^{th}$ boundary surface 250a and a $(2\_2)^{th}$ boundary surface 250b. The $(2\_1)^{th}$ boundary surface 250a may be a portion that partially contacts a bottom surface of the first gate spacer 140, and the $(2\_2)^{th}$ boundary surface 250b may be a portion that partially contacts a bottom surface of the first dummy gate spacer 172.

The second epitaxial layer 250 may include a third plane defect 261 and a fourth plane defect 262 which extend at an angle to the top surface 110a of the first fin-type active pattern 110. In other words, the second epitaxial layer 250 may include the third plane defect 261 and the fourth plane defect 262 which extend at an angle to the top surface of the second region 107 of the field insulating layer 105.

The third plane defect 261 may be adjacent the first gate electrode 120, and the fourth plane defect 262 may be adjacent the first dummy gate electrode 170. Each of the third plane defect 261 and the fourth plane defect 262 may be, e.g., a stacking fault.

The third plane defect 261 may extend obliquely from the $(2\_1)^{th}$ boundary surface 250a toward the bottom surface of the second trench 215, that is, toward a substrate 100. The third plane defect 261 may propagate from the $(2\_1)^{th}$ boundary surface 250a between the second epitaxial layer 250 and the bottom surface of the first gate spacer 140 and may be terminated within the second epitaxial layer 250.

The fourth plane defect 262 may extend obliquely from the $(2\_2)^{th}$ boundary surface 250b toward the bottom surface of the second trench 215, that is, toward the substrate 100. The fourth plane defect 262 may propagate from the $(2\_2)^{th}$ boundary surface 250b between the second epitaxial layer 250 and the bottom surface of the first dummy gate spacer 172 and may be terminated within the second epitaxial layer 150.

Figure 22:
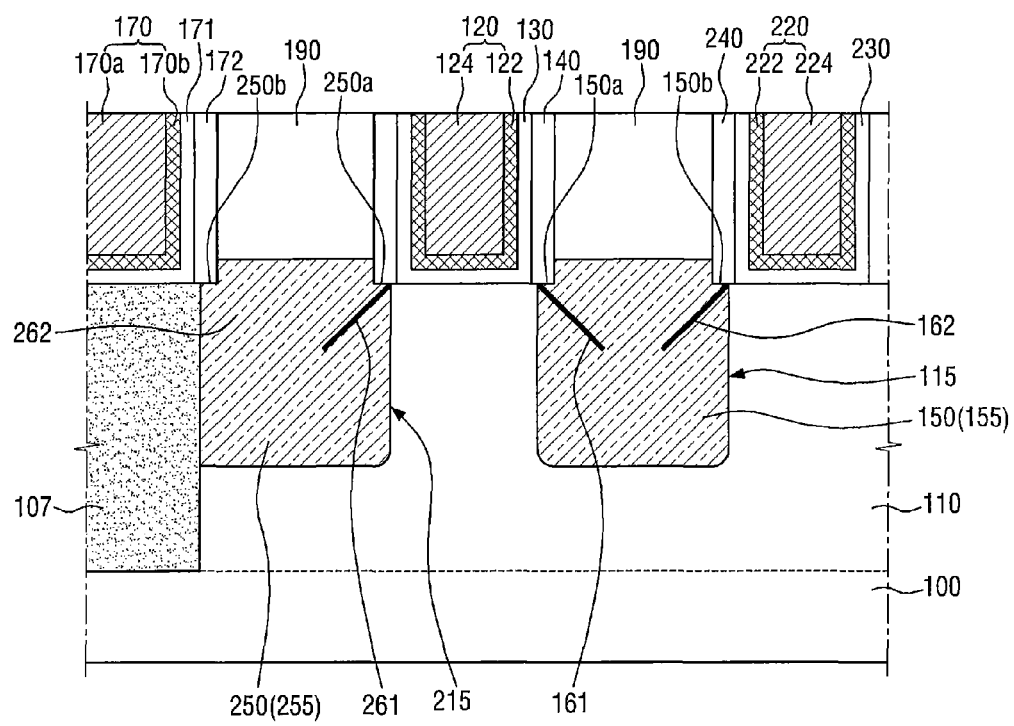
FIG. 22 is a cross-sectional view of a semiconductor device according to a tenth embodiment of the present inventive concept.

FIG. 22 is a cross-sectional view of a semiconductor device 10 according to a tenth embodiment of the present inventive concept. For simplicity, the current embodiment will hereinafter be described, focusing mainly on differences with the embodiment of FIGS. 20 and 21.

Referring to FIG. 22, in the semiconductor device 10 according to the tenth embodiment of the present inventive concept, a second epitaxial layer 250 does not include a fourth plane defect 262.

A second trench 215 is formed at an end of a first fin-type active pattern 110. The second trench 215 may expose a second region 107 of a field insulating layer 105 which contacts short sides of the first fin-type active pattern 110.

Therefore, the second epitaxial layer 250 is formed in the second trench 215, but the second region 107 of the field insulating layer 105 cannot serve as a seed layer for growing the second epitaxial layer 250.

Thus, the second epitaxial layer 250 includes a $(2\_2)^{th}$ boundary surface 250b which contacts a bottom surface of a first dummy gate spacer 172 but does not include a fourth plane defect 262 (see FIG. 21) which extends obliquely from the $(2\_2)^{th}$ boundary surface 250b toward a bottom surface of the second trench 215.

Figure 23:
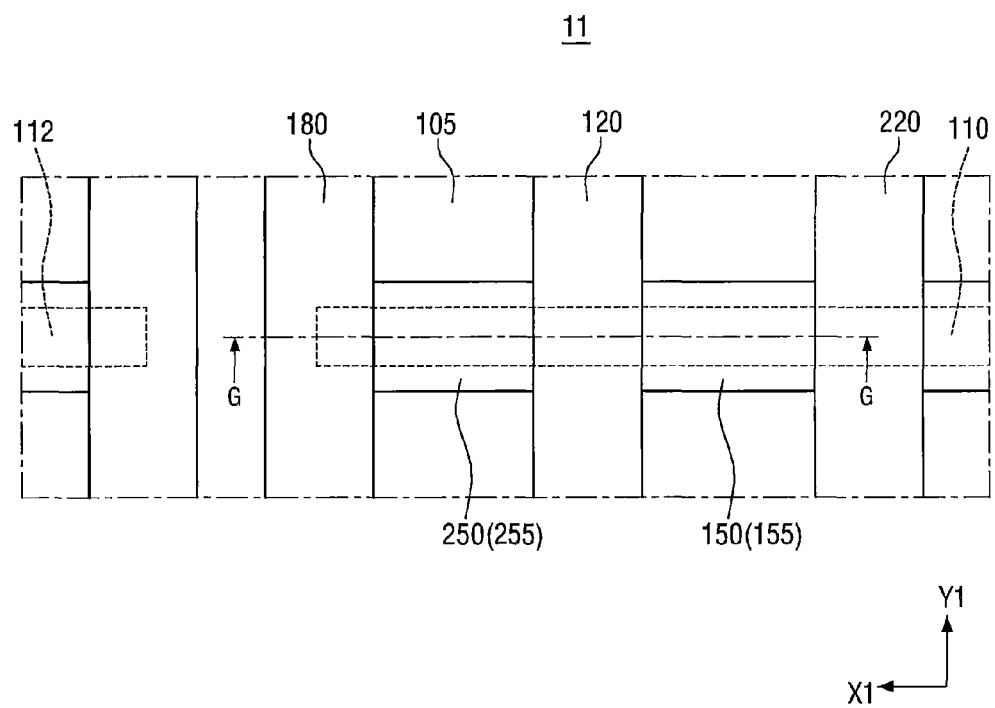
FIG. 23 is a plan view of a semiconductor device according to an eleventh embodiment of the present inventive concept.
Figure 24:
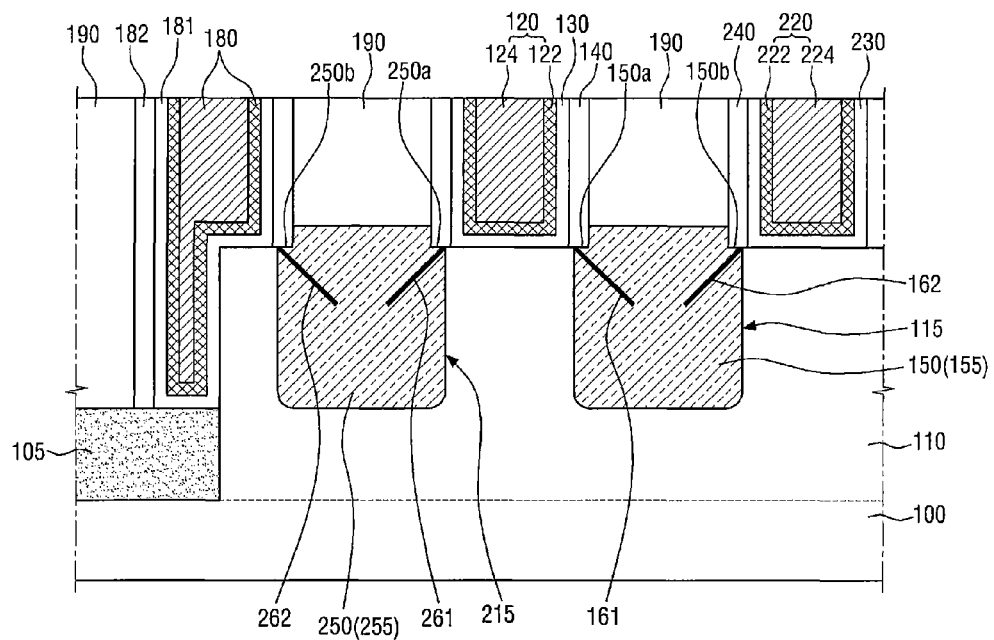
FIG. 24 is a cross-sectional view taken along the line G-G of FIG. 23.

FIG. 23 is a plan view of a semiconductor device 11 according to an eleventh embodiment of the present inventive concept. FIG. 24 is a cross-sectional view taken along the line G-G of FIG. 23. For simplicity, the current embodiment will hereinafter be described, focusing mainly on differences with the embodiment of FIGS. 20 and 21.

Referring to FIGS. 23 and 24, the semiconductor device 11 according to the eleventh embodiment of the present inventive concept includes a second trench 215, a second epitaxial layer 250, and a second dummy gate electrode 180.

The second dummy gate electrode 180 extends along a second direction Y1. Part of the second dummy gate electrode 180 may intersect a first fin-type active pattern 110. More specifically, a portion of the second dummy gate electrode 18 may be formed on the first fin-type active pattern 110, and the other portion of the second dummy gate electrode 180 may be formed on a field insulating layer 105. The second dummy gate electrode 180 may cover an end of the first fin-type active pattern 110.

Second dummy gate spacers 182 may be formed on sidewalls of the second dummy gate electrode 180 which extends along the second direction Y1.

The second trench 215 may be formed between a first gate electrode 120 and the second dummy gate electrode 180. More specifically, the second trench 215 may be formed between a first gate spacer 140 and a second dummy gate spacer 182 which face each other.

The second trench 215 is formed within the first fin-type active pattern 110. The second trench 215 is formed at an end of the first fin-type active pattern 110 but may include two sidewalls and a bottom surface which are exposed portions of the first fin-type active pattern 110.

A sidewall of the second trench 215 and a sidewall of the first gate spacer 140 are not aligned in a row with each other, and the other sidewall of the second trench 215 and a sidewall of the second dummy gate spacer 182 are not aligned in a row with each other. The first fin-type active pattern 110 may be undercut under the first gate spacer 140 and the second dummy gate spacer 182.

A second source/drain region 255 includes the second epitaxial layer 250. The second epitaxial layer 250 may fill the second trench 215. The second epitaxial layer 250 is formed on the first fin-type active pattern 110 and near the end of the first fin-type active pattern 110.

The second epitaxial layer 250 may include a $(2\_1)^{th}$ boundary surface 250a and a $(2\_2)^{th}$ boundary surface 250b. The $(2\_1)^{th}$ boundary surface 250a may be a portion that partially contacts a bottom surface of the first gate spacer 140, and the $(2\_2)^{th}$ boundary surface 250b may be a portion that partially contacts a bottom surface of the second dummy gate spacer 182.

The second epitaxial layer 250 may include a third plane defect 261 and a fourth plane defect 262 which extend at an angle to a top surface 110a of the first fin-type active pattern 110. The third plane defect 261 may be adjacent the first gate electrode 120, and the fourth plane defect 262 may be adjacent the second dummy gate electrode 180.

The third plane defect 261 may propagate from the $(2\_1)^{th}$ boundary surface 250a between the second epitaxial layer 250 and the bottom surface of the first gate spacer 140, and the fourth plane defect 262 may propagate from the $(2\_2)^{th}$ boundary surface 250b between the second epitaxial layer 250 and the bottom surface of the second dummy gate spacer 182.

Figure 25:
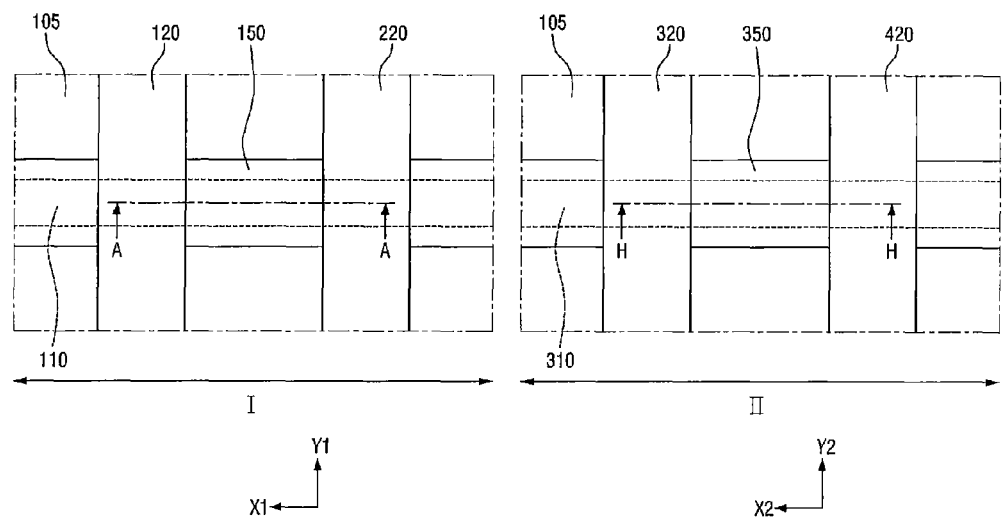
FIG. 25 is a plan view of a semiconductor device according to a twelfth embodiment of the present inventive concept.
Figure 26:
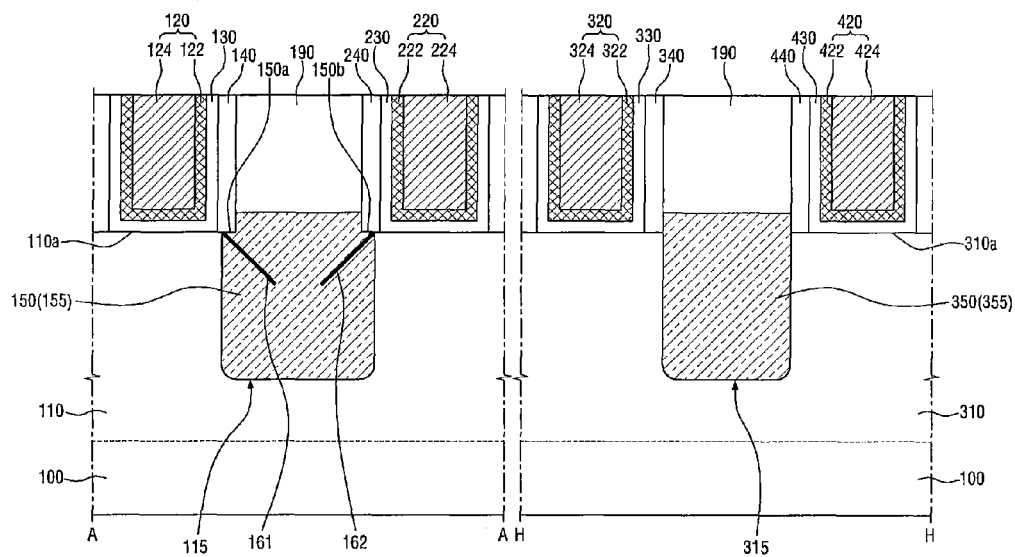
FIG. 26 is a cross-sectional view taken along the lines A-A and H-H of FIG. 25.

FIG. 25 is a plan view of a semiconductor device 12 according to a twelfth embodiment of the present inventive concept. FIG. 26 is a cross-sectional view taken along the lines A-A and H-H of FIG. 25.

Referring to FIGS. 25 and 26, the semiconductor device 12 according to the twelfth embodiment of the present inventive concept may include a first fin-type active pattern 110, a second fin-type active pattern 310, a first gate electrode 120, a second gate electrode 220, a third gate electrode 320, a fourth gate electrode 420, first gate spacers 140, second gate spacers 240, third gate spacers 340, fourth gate spacers 440, a first trench 115, a third trench 315, a first epitaxial layer 150, and a third epitaxial layer 350.

A substrate 100 may include a first area I and a second area II. The first area I and the second area II may be separated from each other or connected to each other.

In the semiconductor device 12 according to the twelfth embodiment of the present inventive concept, the first area I and the second area II may be areas where transistors of the same conductivity type are formed.

In the first area I, the first fin-type active pattern 110, the first gate electrode 120, the second gate electrode 220, the first gate spacers 140, the second gate spacers 240, the first trench 115, the first epitaxial layer 150, etc. may be formed.

The above elements may be substantially the same as those described above with reference to FIGS. 1 through 8, and thus a description thereof will be omitted.

In the second area II, the second fin-type active pattern 310 protrudes from the substrate 100. The second fin-type active pattern 310 may be defined by a field insulating layer 105. The second fin-type active pattern 310 may extend along a third direction X2. Like the first fin-type active pattern 110, the second fin-type active pattern 310 may include various semiconductor materials. However, in the semiconductor device 12 according to the twelfth embodiment of the present inventive concept, a case where the second fin-type active pattern 310 is a silicon fin-type active pattern that contains silicon will be described.

The third gate electrode 320 and the fourth gate electrode 420 may extend along a fourth direction Y2 to intersect the second fin-type active pattern 310. The third gate electrode 320 and the fourth gate electrode 420 may be formed on the second fin-type active pattern 310 and the field insulating layer 105.

The fourth gate electrode 420 may be formed side by side with the third gate electrode 320. The third gate electrode 320 and the fourth gate electrode 420 may be arranged along the third direction X2.

The third gate electrode 320 may include a fifth metal layer 322 and a sixth metal layer 324, and the fourth gate electrode 420 may include a seventh metal layer 422 and an eighth metal layer 424. A description of the third gate electrode 320 and the fourth gate electrode 420 is similar to the description of the first gate electrode 120 and thus will be omitted.

The third gate spacers 340 may be formed on sidewalls of the third gate electrode 320 extending along the fourth direction Y2, and the fourth gate spacers 440 may be formed on sidewalls of the fourth gate electrode 420 extending along the fourth direction Y2.

The third trench 315 may be formed between the third gate electrode 320 and the fourth gate electrode 420. More specifically, the third trench 315 may be formed between a third gate spacer 340 and a fourth gate spacer 440 which face each other. The third trench 315 is formed within the second fin-type active pattern 310.

In the semiconductor device 12 according to the twelfth embodiment of the present inventive concept, a sidewall of the third trench 315 and a sidewall of the third gate spacer 340 are aligned in a row with each other, and a sidewall of the third trench 315 and a sidewall of the fourth gate spacer 440 are aligned in a row with each other.

A third source/drain region 355 is formed on the second fin-type active pattern 310 between the third gate electrode 320 and the fourth gate electrode 420. The third source/drain region 355 may be a shared source/drain region common to the third gate electrode 320 and the fourth gate electrode 420.

The third source/drain region 355 includes the third epitaxial layer 350. The third epitaxial layer 350 may fill the third trench 315. The third epitaxial layer 350 may be formed on the second fin-type active pattern 310.

A sidewall of the third trench 315 and a sidewall of the third gate spacer 340 are aligned in a row with each other, and a sidewall of the third trench 315 and a sidewall of the fourth gate spacer 440 are aligned in a row with each other. That is, in the semiconductor device 12 according to the twelfth embodiment of the present inventive concept, the third epitaxial layer 350 does not include a boundary surface which contacts a bottom surface of the third gate spacer 340 and a boundary surface which contacts a bottom surface of the fourth gate spacer 440.

Therefore, the third epitaxial layer 350 does not include plane defects which extend toward a bottom surface of the third trench 315 at an angle to a top surface 310a of the second fin-type active pattern 310. That is, the third epitaxial layer 350 does not include a stacking fault which extends obliquely from the bottom surface of the third gate spacer 340 toward the substrate 100 and a stacking fault which extends obliquely from the bottom surface of the fourth gate spacer 440 toward the substrate 100.

Figure 27:
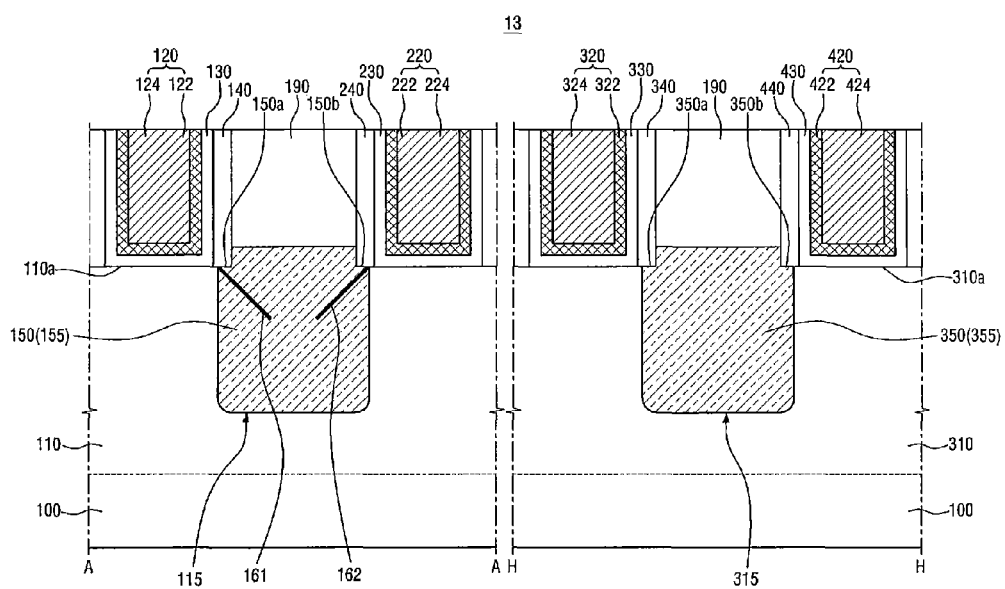
FIG. 27 is a cross-sectional view of a semiconductor device according to a thirteenth embodiment of the present inventive concept.

FIG. 27 is a cross-sectional view of a semiconductor device 13 according to a thirteenth embodiment of the present inventive concept. Specifically, FIG. 27 is a cross-sectional view taken along the lines A-A and H-H of FIG. 25. For simplicity, the current embodiment will hereinafter be described, focusing mainly on differences with the embodiment of FIGS. 25 and 26.

Referring to FIG. 27, in the semiconductor device 13 according to the thirteenth embodiment of the present inventive concept, a first area I and a second area II may be areas where transistors of the same conductivity type are formed.

In the semiconductor device 13 according to the thirteenth embodiment of the present inventive concept, a sidewall of a third trench 315 and a sidewall of a third gate spacer 340 are not aligned in a row with each other, and a sidewall of the third trench 315 and a sidewall of a fourth gate spacer 440 are not aligned in a row with each other. That is, a second fin-type active pattern 310 may be undercut under the third gate spacer 340 and/or the fourth gate spacer 440.

Therefore, a third epitaxial layer 350 may include a $(3\_1)^{th}$ boundary surface 350a and a $(3\_2)^{th}$ boundary surface 350b. The $(3\_1)^{th}$ boundary surface 350a may be a portion that partially contacts a bottom surface of the third gate spacer 340, and the $(3\_2)^{th}$ boundary surface 350b may be a portion that partially contacts a bottom surface of the fourth gate spacer 440.

In the semiconductor device 13 according to the thirteenth embodiment of the present inventive concept, the third epitaxial layer 350 includes the $(3\_1)^{th}$ boundary surface 350a and/or the $(3\_2)^{th}$ boundary surface 350b which contacts the bottom surface of the third gate spacer 340 and/or the bottom surface of the fourth gate spacer 440. However, the third epitaxial layer 350 does not include a stacking fault which extends obliquely from the $(3\_1)^{th}$ boundary surface 350a and/or the $(3\_2)^{th}$ boundary surface 350b toward a bottom surface of the third trench 315.

For example, when the second fin-type active pattern 310 and the third epitaxial layer 350 include the same material, the third epitaxial layer 350 may not include a stacking fault which extends from the $(3\_1)^{th}$ boundary surface 350a and/or the $(3\_2)^{th}$ boundary surface 350b toward a substrate 100 at an angle to a top surface 310a of the second fin-type active pattern 310.

Examples of an electronic system using the semiconductor devices described above with reference to FIGS. 1 through 27 will now be described.

Figure 28:
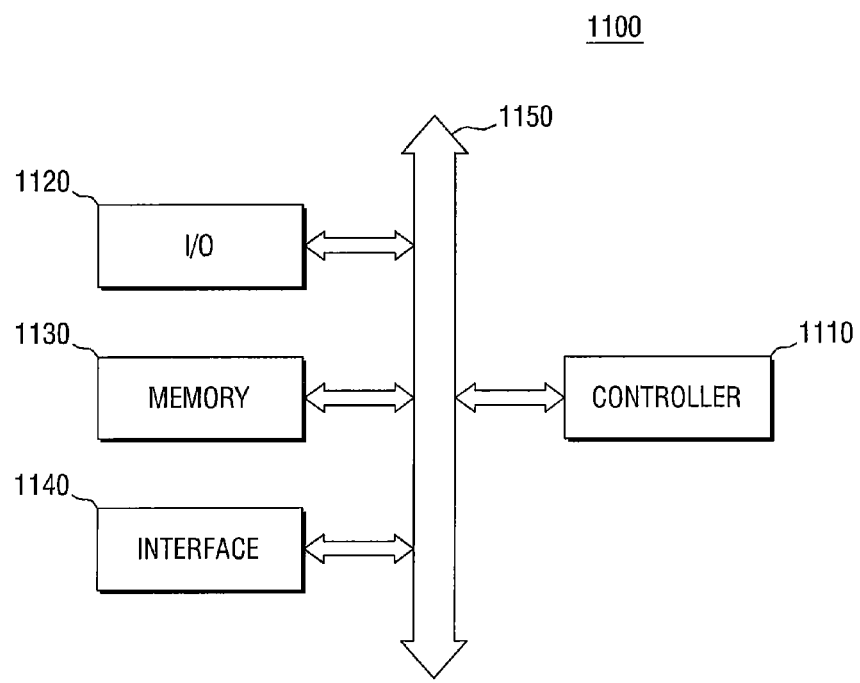
FIG. 28 is a block diagram of an electronic system including semiconductor devices according to some embodiments of the present inventive concept.

FIG. 28 is a block diagram of an electronic system 1100 including semiconductor devices according to embodiments of the present inventive concept.

Referring to FIG. 28, the electronic system 1100 may include a controller 1110, an input/output (I/O) device 1120, a memory device 1130, an interface 1140 and a bus 1150. The controller 1110, the I/O device 1120, the memory device 1130 and/or the interface 1140 may be connected to one another by the bus 1150. The bus 1150 may serve as a path for transmitting data.

The controller 1110 may include at least one of a microprocessor, a digital signal processor, a microcontroller and/or logic devices capable of performing similar functions to those of a microprocessor, a digital signal processor and/or a microcontroller. The I/O device 1120 may include a keypad, a keyboard and/or a display device. The memory device 1130 may store data and/or commands. The interface 1140 may be used to transmit data to and/or receive data from a communication network. The interface 1140 may be a wired or wireless interface. In an example, the interface 1140 may include an antenna or a wired or wireless transceiver. Although not illustrated in the drawing, the electronic system 1100 may be an operating memory for improving the operation of the controller 1110, and may further include a high-speed DRAM or SRAM. Here, any one of the semiconductor devices according to the above-described embodiments of the present inventive concept may be provided in the memory device 1130 or in the controller 1110 or the I/O device 1120.

The electronic system 1100 may be applied to nearly all types of electronic products capable of transmitting and/or receiving information in a wireless environment, such as a personal data assistant (PDA), a portable computer, a web tablet, a wireless phone, a mobile phone, a digital music player, and/or a memory card, among others.

Figure 29:
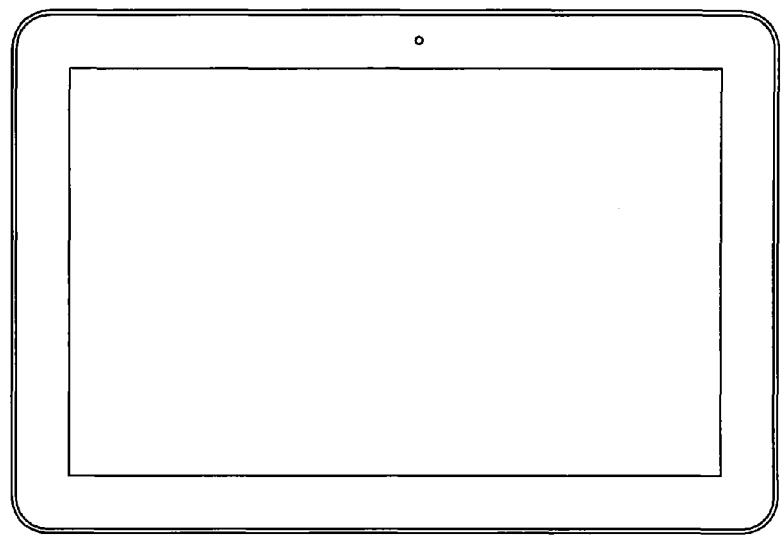
FIGS. 29 and 30 are diagrams illustrating examples of a semiconductor system to which semiconductor devices according to some embodiments of the present inventive concept can be applied.
Figure 30:
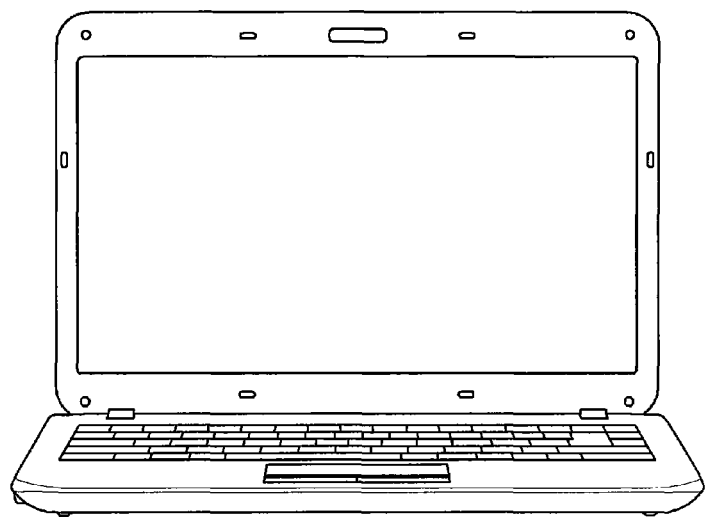

FIGS. 29 and 30 are diagrams illustrating examples of a semiconductor system to which semiconductor devices according to embodiments of the present inventive concept can be applied. FIG. 29 illustrates a tablet personal computer (PC), and FIG. 30 illustrates a notebook computer. At least one of the semiconductor devices according to the above-described embodiments of the present inventive concept, as set forth herein, may be used in the tablet PC and the notebook computer. The semiconductor devices according to the embodiments of the present inventive concept, as set forth herein, may also be applied to various IC devices other than those set forth herein.

FIGS. 31 to 37 are views showing intermediate steps of a method of manufacturing a semiconductor device according to some embodiments of the present inventive concept.

Figure 31:
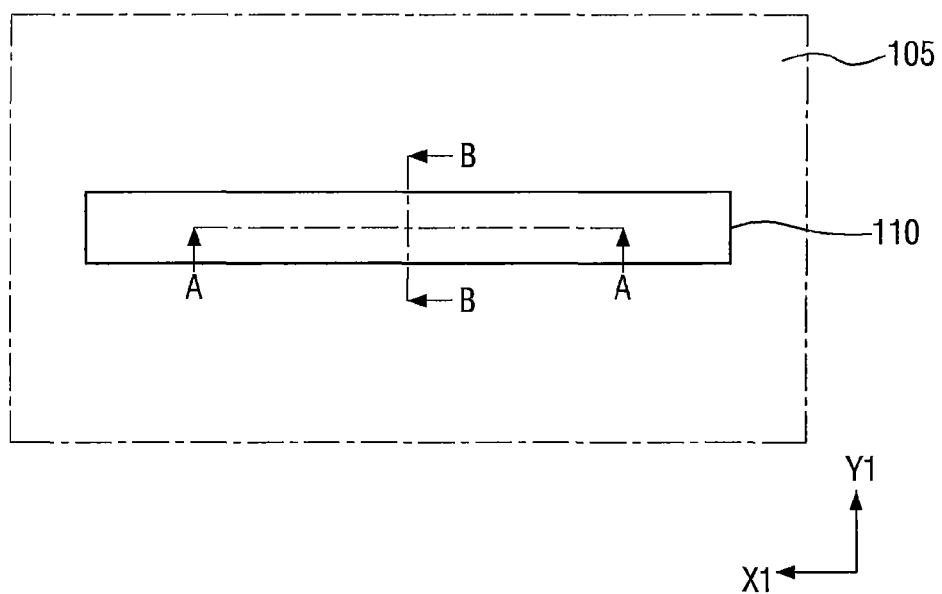
FIGS. 31 to 37 are views showing intermediate steps of a method of manufacturing a semiconductor device according to some embodiments of the present inventive concept.
Figure 32A:
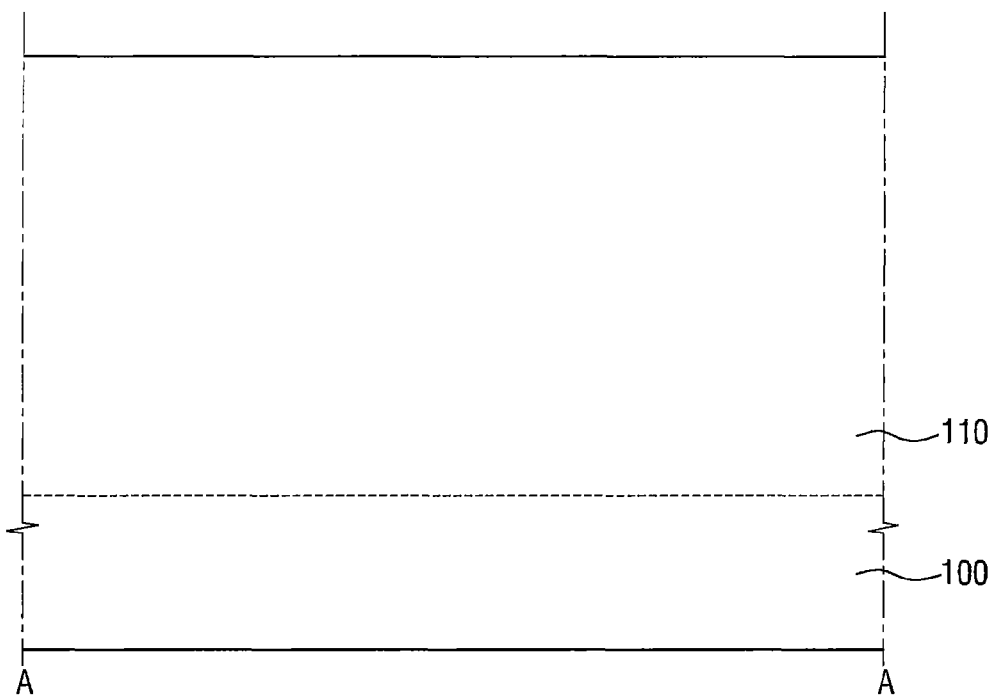
Figure 32B:
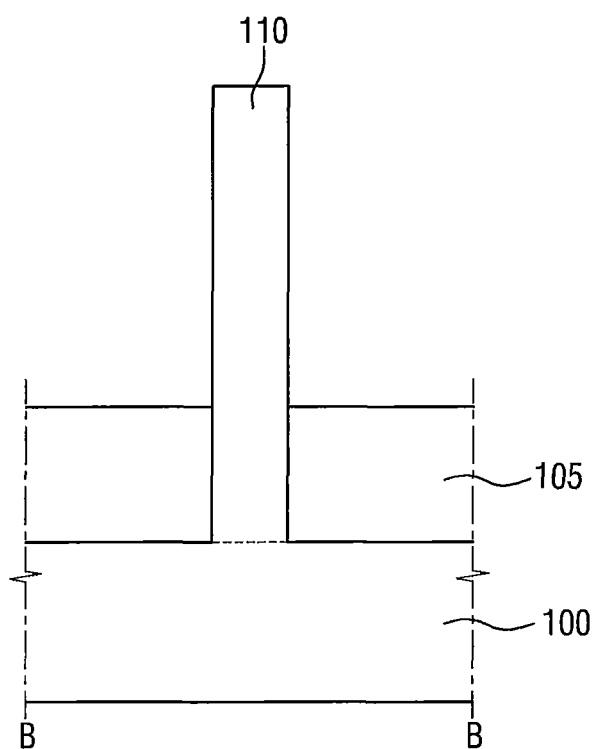

FIG. 32a is a cross-sectional view taken along line A-A of FIG. 31, and FIG. 32b is a cross-sectional view taken along line B-B of FIG. 31. Further, the manufacturing method to be described with reference to FIGS. 33 to 37 includes steps starting from the state shown in FIG. 32a.

Referring to FIGS. 31 to 32b, the first fin-type active pattern 110 is formed to protrude from the substrate 100.

The first fin-type active pattern 110 may be elongated along the first direction X1. The field insulating layer 105 may be formed to partially cover sidewalls of the first fin-type active pattern 110.

Figure 33:
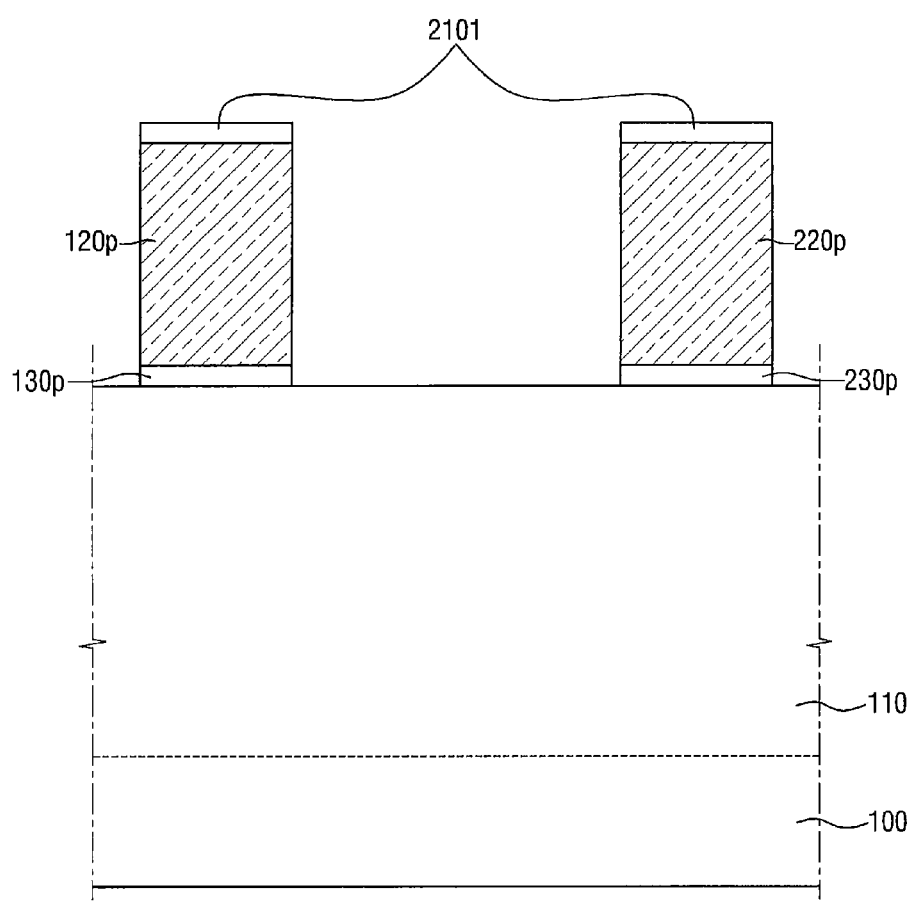

Referring to FIG. 33, a first dummy gate electrode 120p and a second dummy gate electrode 220p may be formed on the first fin-type active pattern 110 to intersect the first fin-type active pattern 110.

The first dummy gate electrode 120p and the second dummy gate electrode 220p may be formed through an etching process using a mask pattern 2101. The first dummy gate electrode 120p and the second dummy gate electrode 220p may include, for example, polysilicon or amorphous silicon.

A first dummy gate insulating layer 130p may be formed between the first dummy gate electrode 120p and the first fin-type active pattern 110, and a second dummy gate insulating layer 230p may be formed between the second dummy gate electrode 220p and the first fin-type active pattern 110. The first dummy gate insulating layer 130p and the second dummy gate insulating layer 230p may include, for example, a silicon oxide layer.

Figure 34:
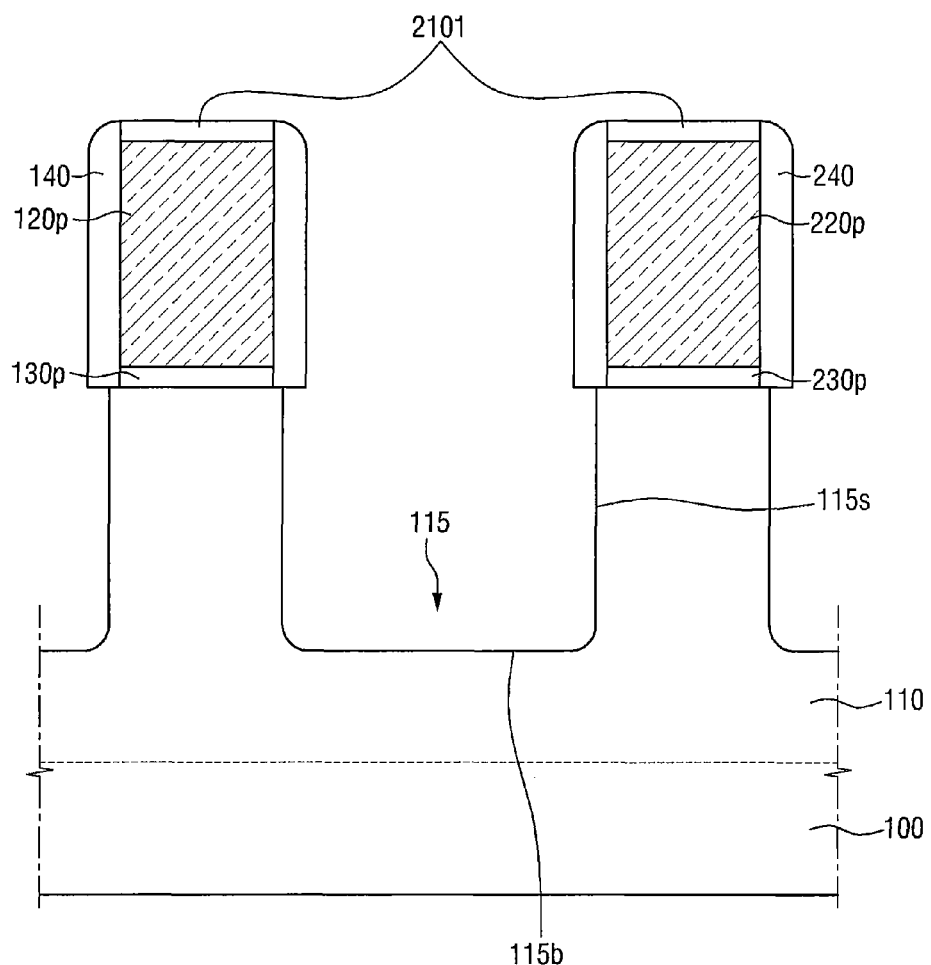

Referring to FIG. 34, the first gate spacers 140 may be formed on sidewalls of the first dummy gate electrode 120p, and the second gate spacers 240 may be formed on sidewalls of the second dummy gate electrode 220p.

The first trench 115 may be formed in the first fin-type active pattern 110 while the first gate spacers 140 and the second gate spacers 240 are formed. The first trench 115 may include sidewalls 115s and a bottom surface 115b connecting the sidewalls 115s.

The first trench 115 may be formed between the first dummy gate electrode 120p and the second dummy gate electrode 220p. The sidewalls 115s of the first trench and the sidewalls of the first gate spacers 140 are not arranged in a line, and the sidewalls 115s of the first trench and the sidewalls of the second gate spacers 240 are not arranged in a line.

Figure 35:
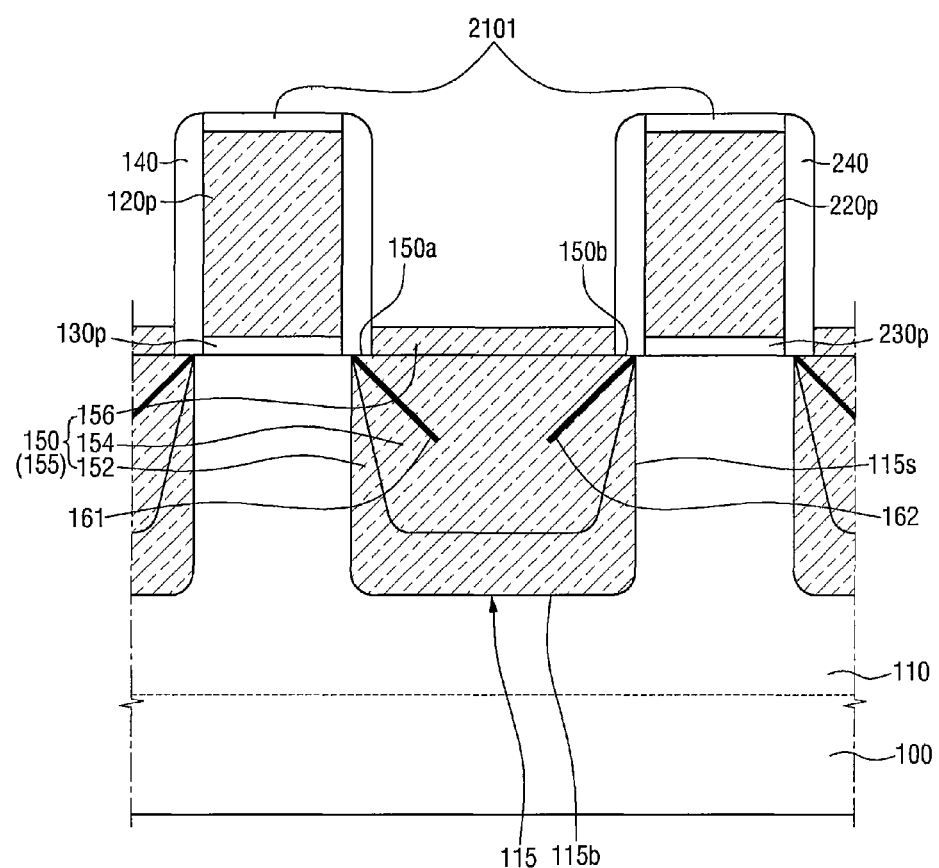

Referring to FIG. 35, the first source/drain region 155 may be formed between the first dummy gate electrode 120p and the second dummy gate electrode 220p.

The first source/drain region 155 may include the first epitaxial layer 150 to fill up the first trench 115. The first epitaxial layer 150 may be formed on the first fin-type active pattern 110.

The first epitaxial layer 150 may include the first lower epitaxial layer 152, the first upper epitaxial layer 154, and the first capping epitaxial layer 156. The first lower epitaxial layer 152 is formed along the sidewalls 115s of the first trench and the bottom surface 115b of the first trench. The first upper epitaxial layer 154 fills up the first trench 115 in which the first lower epitaxial layer 152 has been formed. The first capping epitaxial layer 156 may be formed on the first upper epitaxial layer 154.

For example, the first lower epitaxial layer 152 may be formed by epitaxial growth in which the growth rate from the sidewalls 115s of the first trench is higher than the growth rate from the bottom surface 115b of the first trench. Thus, the first lower epitaxial layer 152 may not be grown along the $(1\_1)^{th}$ boundary surface 150a and the $(1\_2)^{th}$ boundary surface 150b.

For example, the first upper epitaxial layer 154 may be formed by epitaxial growth in which the growth rate from the sidewalls 115s of the first trench is higher than the epitaxial growth of the first lower epitaxial layer 152. As the growth rate from the sidewalls 115s of the first trench increases, the first upper epitaxial layer 154 may be grown along the $(1\_1)^{th}$ boundary surface 150a and the $(1\_2)^{th}$ boundary surface 150b.

Since the first upper epitaxial layer 154 is grown along the $(1\_1)^{th}$ boundary surface 150a and the $(1\_2)^{th}$ boundary surface 150b, the first plane defect 161 propagating from the $(1\_1)^{th}$ boundary surface 150a and the second plane defect 162 propagating from and the $(1\_2)^{th}$ boundary surface 150b may be generated.

Figure 36:
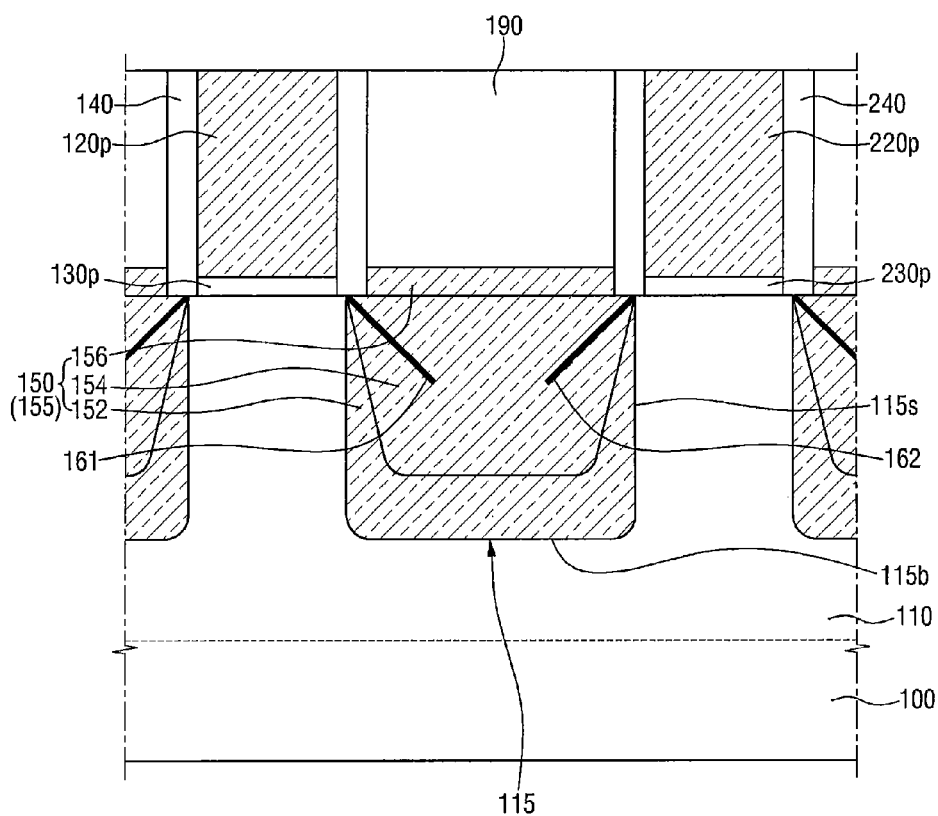

Referring to FIG. 36, the interlayer insulating film 190 may be formed to cover the first source/drain region 155 and the first and second dummy gate electrodes 120p and 220p.

The interlayer insulating film 190 may include at least one of an oxide film, a nitride film, an oxynitride film and a low dielectric constant material.

Then, the interlayer insulating film 190 is planarized until the upper surfaces of the first and second dummy gate electrodes 120p and 220p are exposed. Accordingly, the mask pattern 2101 may be removed to expose the upper surfaces of the first and second dummy gate electrodes 120p and 220p.

Figure 37:
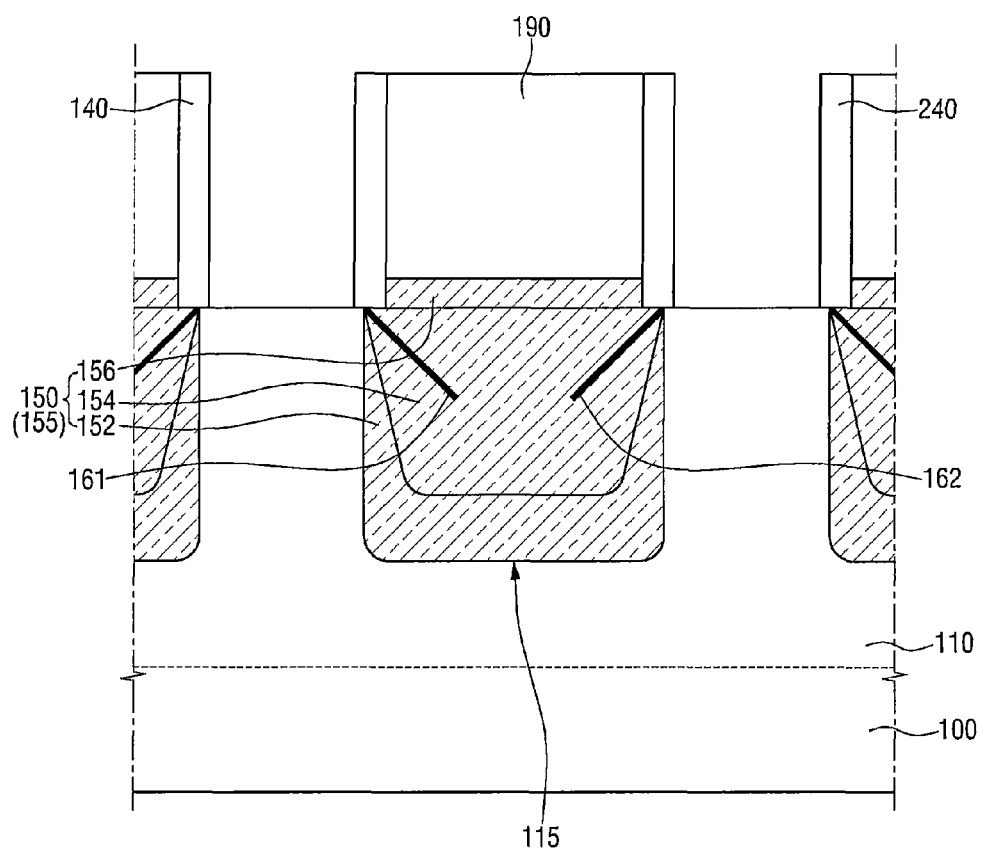

Referring to FIG. 37, the first and second dummy gate electrodes 120p and 220p are removed and the first and second dummy gate insulating layers 130p and 230p are removed.

By removing the first and second dummy gate electrodes 120p and 220p and the first and second dummy gate insulating layers 130p and 230p, a portion of the first fin-type active pattern 110 may be exposed.

Subsequently, as shown in FIG. 3, the first gate insulating layer 130 and the first gate electrode 120 may be formed in a space from which the first and second dummy gate electrodes 120p and 220p have been removed, and the second gate insulating layer 230 and the second gate electrode 220 may be formed in a space from which the first and second dummy gate insulating layers 130p and 230p have been removed.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the inventive concept.

What is claimed is:

1. A semiconductor device comprising:
an active pattern on a substrate;
first and second gate electrodes on the active pattern and arranged in a first direction relative to one another;
a first source/drain region in a first trench that extends into the active pattern between the first and second gate electrodes, the first source/drain region including a first epitaxial layer in the first trench that includes a first plane defect that originates at a first origination location that is at a top portion of the first epitaxial layer and that extends towards a bottom portion of the first epitaxial layer, a second plane defect that originates at a second origination location that is at the top portion of the first epitaxial layer and that extends towards the bottom portion of the first epitaxial layer; and
first and second gate spacers on sidewalls of the first and second gate electrodes, respectively
wherein the first gate spacer overlaps the first origination location of the first plane defect in a third direction that extends away from the substrate,
wherein the first plane defect and the second plane defect are symmetrical with respect to a center of the first epitaxial layer and are completely located within the first epitaxial layer and are non-intersecting,
wherein the first origination location is positioned at a boundary surface between the first gate spacer and the first epitaxial layer, and
wherein a portion of the first epitaxial layer is disposed between a bottom surface of the first gate spacer and the first plane defect at the first origination location, and between a bottom surface of the second gate spacer and the second plane defect at the second origination location.

2. The semiconductor device according to claim 1, wherein the first and second gate spacers comprise a portion that extends beyond a sidewall of the first trench to have a first distance between the first and second gate spacers that is less than a second distance between opposite sidewalls of the first trench.

3. The semiconductor device according to claim 1, wherein the first epitaxial layer comprises:
a first lower epitaxial layer that is on at least a portion of a bottom surface of the first trench;
a first upper epitaxial layer that is on the first lower epitaxial layer; and
a first capping epitaxial layer that is on the first upper epitaxial layer.

4. The semiconductor device according to claim 1, wherein the first plane defect and the second plane defect each extend towards one another at an angle relative to a top surface of the active pattern.

5. The semiconductor device according to claim 1,
wherein the first plane defect is overlapped by the first gate spacer in the third direction that extends away from the substrate at a first upper portion of the first plane defect that is nearest the first gate spacer, and
wherein the second plane defect is overlapped by the second gate spacer in the third direction at a second upper portion of the second plane defect that is nearest the second gate spacer.

6. The semiconductor device according to claim 1, wherein the first epitaxial layer comprises:
a first lower epitaxial layer that is on at least a portion of a bottom surface of the first trench; and
a first upper epitaxial layer that is on the first lower epitaxial layer, and
wherein the first plane defect and the second plane defect propagate from the first upper epitaxial layer and terminate within the first upper epitaxial layer.

7. The semiconductor device according to claim 1, wherein a height of the first plane defect from the active pattern increases as a distance from the first gate electrode decreases.

8. The semiconductor device according to claim 1, wherein a width of the first plane defect decreases as a distance to the first gate electrode decreases.

9. The semiconductor device according to claim 1, wherein the first epitaxial layer comprises:
a first lower epitaxial layer that is on at least a portion of a bottom surface of the first trench; and
a first upper epitaxial layer that is on the first lower epitaxial layer, and
wherein the first lower epitaxial layer contacts a bottom surface of each of the first and second gate spacers.

10. The semiconductor device according to claim 9,
wherein the first and second plane defects propagate from the first lower epitaxial layer and terminate in the first upper epitaxial layer.

11. The semiconductor device according to claim 1,
wherein the active pattern comprises a fin-type active pattern extending from a top surface of the substrate and extending in the first direction, and
wherein the first and second gate electrodes extend across the fin-type active pattern in a second direction that is different from the first direction.

12. The semiconductor device according to claim 11, wherein the first epitaxial layer comprises:
a first lower epitaxial layer that is on at least a portion of a bottom surface of the first trench;
a first upper epitaxial layer that is on the first lower epitaxial layer; and
a first capping epitaxial layer that is on the first upper epitaxial layer,
wherein the fin-type active pattern comprises a first fin-type active pattern, the semiconductor device further comprising a second fin-type active pattern extending from the top surface of the substrate and in the first direction and spaced apart from the first fin-type active pattern in the second direction,
wherein the first and second gate electrodes are on and extend across the second fin-type active pattern in the second direction,
the semiconductor device further comprising a second source/drain region in a second trench that extends into the second fin-type active pattern between the first and second gate electrodes, the second source/drain region including a second epitaxial layer that is in the second trench and that includes at least one plane defect that is terminated within the second epitaxial layer.

13. The semiconductor device according to claim 12, wherein the second epitaxial layer comprises:
a second lower epitaxial layer that is on at least a portion of a bottom surface of the second trench in the second fin-type active pattern;
a second upper epitaxial layer that is on the second lower epitaxial layer; and
a second capping epitaxial layer that is on the second upper epitaxial layer, and
wherein the first capping epitaxial layer is directly connected to the second capping epitaxial layer.

14. The semiconductor device according to claim 1,
wherein the active pattern comprises a fin-type active pattern extending from a top surface of the substrate and extending in the first direction,
wherein the first and second gate electrodes extend across the fin-type active pattern in a second direction that is different from the first direction, and
wherein the first trench is on a first side of the first gate electrode,
the semiconductor device further comprising a second source/drain region in a second trench that extends into the active pattern on a second side of the first gate electrode, the second source/drain region including a second epitaxial layer that is in the second trench and that includes a third plane defect that originates at a top portion of the second epitaxial layer proximate the first gate electrode and extends towards a bottom portion of the second epitaxial layer.

15. The semiconductor device according to claim 14, further comprising a dummy gate electrode that extends across the fin-type active pattern in the second direction and is arranged in the first direction relative to the first and second gate electrodes,
wherein the second trench is between the first gate electrode and the dummy gate electrode.

16. The semiconductor device according to claim 15, wherein the second epitaxial layer includes a fourth plane defect that originates at the top portion of the second epitaxial layer proximate the dummy gate electrode and extends towards the bottom portion of the second epitaxial layer.

17. The semiconductor device according to claim 16, further comprising a field insulating layer formed on the substrate and sidewalls of the fin-type active pattern,
wherein a first portion of the fin-type active pattern protrudes from the field insulating layer in a direction away from the substrate,
wherein a first region of the field insulating layer contacts long sides of the fin-type active pattern and a second region of the field insulating layer contacts short sides of the fin-type active pattern, and wherein a second portion of the fin-type active pattern is interposed between the second region of the field insulating layer and the second epitaxial layer.

18. The semiconductor device according to claim 16, further comprising a field insulating layer formed on the substrate and sidewalls of the fin-type active pattern, wherein a first portion of the fin-type active pattern protrudes from the field insulating layer in a direction away from the substrate, wherein the dummy gate electrode includes a first portion that is formed on the fin-type active pattern and a second portion that is formed on the field insulating layer, and wherein a second portion of the fin-type active pattern is interposed between the second portion of the dummy gate electrode and the second epitaxial layer.

* * * * *